(12) United States Patent
Watanabe et al.

(10) Patent No.: US 8,007,925 B2
(45) Date of Patent: Aug. 30, 2011

(54) ORGANIC ELECTROLUMINESCENCE DEVICE AND DISPLAY APPARATUS

(75) Inventors: Taiki Watanabe, Tokyo (JP); Akira Tsuboyama, Tokyo (JP); Satoru Shiobara, Tokyo (JP); Koichi Suzuki, Yokohama (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 982 days.

(21) Appl. No.: 11/759,554

(22) Filed: Jun. 7, 2007

(65) Prior Publication Data

US 2007/0292717 A1    Dec. 20, 2007

(30) Foreign Application Priority Data

Jun. 15, 2006    (JP) .................................. 2006-165462

(51) Int. Cl.
 *H01L 51/54*    (2006.01)
(52) U.S. Cl. .......... 428/690; 428/917; 313/504; 257/40; 257/E51.032; 257/E51.044
(58) Field of Classification Search ........................ None
See application file for complete search history.

(56) References Cited

U.S. PATENT DOCUMENTS

| 7,078,115 | B2 | 7/2006 | Takiguchi | |
|---|---|---|---|---|
| 7,108,924 | B2 | 9/2006 | Kamatani | |
| 2003/0011304 | A1* | 1/2003 | Duineveld et al. | 313/506 |
| 2003/0186080 | A1* | 10/2003 | Kamatani et al. | 428/690 |
| 2005/0196639 | A1 | 9/2005 | Kamatani | |
| 2005/0221115 | A1 | 10/2005 | Tsuboyama | |
| 2008/0009627 | A1 | 1/2008 | Tsuboyama | |

OTHER PUBLICATIONS

G.H. Chen, et al., "Recent Developments in Molecular Organic Electroluminescent Materials", Macromol. Symp. vol. 125, pp. 1-48 (1997).
D.F.O'Brien, et al., "Improved energy transfer in electrophosphorescent devices". Applied Physics Letters, vol. 74, No. 3, pp. 442-444 (1999).
M.A. Baldo, et al., "Very high-efficiency green organic light-emitting devices based on electrophosphorescence", Applied Science Letters, vol. 75, No. 1, pp. 4-6 (1999).
J.H. Burroughes, et al., "Light-emitting diodes based on conjugated polymer", Nature, vol. 347, pp. 539-541 (1990).
Albertus J. Sandee, et al., "Solution-Processible Conjugated Electrophosphorescent Polymers", J. Am. Chem. Soc. vol. 126, pp. 7041-7048 (2004) m.
Mitsunori Suzuki, et al., "Highly efficient polymer light-emitting devices using ambipolar phosphorescent polymers", Applied Physics Letters, vol. 86, pp. 103507-1 to 103507-3 (2005).
Norio Miyaura, et al., "Palladium-Catalyzed Cross-Coupling Reactions of Organoboron Compounds", Chem. Rev., vol. 95, No. 7, pp. 2457-2483 (1995).
Takakazu Yamamoto, et al., "A Novel Type of Polycondensation Utilizing Transition Metal-Catalyzed C-C Coupling. I. Preparation of Thermostable Polyphenylene Type Polymer", Bulletin of the Chemical Society of Japan, vol. 51 (7), pp. 2091-2097 (1978).
Saswati Ghosal, et al., "Formaiton of 1,3-Diynes, 1,3-Dienes, and Biphenyls via the Copper (II) Nitrate Mediated Coupling of Organotin Compounds", J. Org. Chem., vol. 52, pp. 4296-4298 (1987).

\* cited by examiner

*Primary Examiner* — Dawn L. Garrett
*Assistant Examiner* — Andrew K Bohaty
(74) *Attorney, Agent, or Firm* — Fitzpatrick, Cella, Harper & Scinto

(57) ABSTRACT

The present invention provides an organic electroluminescence device using a novel phosphorescent metal complex compound and having high efficiency, high luminance, and high durability. The organic electroluminescence device includes a pair of electrodes including an anode and a cathode, and one or more organic layers each containing an organic compound, the one or more organic layers being interposed between the pair of electrodes, wherein at least one of the one or more organic layers contain a phosphorescent metal complex compound having at least one ligand structure represented by the following general formula (1):

where at least one of X, Y and Z represents an aromatic oligomer having 13 or more carbon atoms and bonded directly or via a linking group.

4 Claims, 3 Drawing Sheets

ORGANIC ELECTROLUMINESCENCE DEVICE AND DISPLAY APPARATUS

BACKGROUND OF THE INVENTION

1. Field of the Invention

The present invention relates to an organic light-emitting device (also referred to as "organic electroluminescence device" or "organic EL device") which includes a novel metal complex compound for a light-emitting device; and is used in, for example, a surface light source or a flat panel display.

2. Description of the Related Art

An organic electroluminescence device has been recently expected to find applications in next-generation full-color displays because of its characteristics of a low driving voltage, high responsiveness, high efficiency, and high visibility. In association with the recent expectation, an applied research for forming an organic electroluminescence device that can be practically used, including the development of a material for such device, has been vigorously conducted.

As detailed in Macromol. Symp. 125, 1 to 48 (1997), an organic electroluminescence device is generally of such a structure that organic layers including a fluorescent light-emitting layer are formed between two electrodes as upper and lower electrodes formed on a transparent substrate.

Recently, studies have been made on a device using not only conventional light emission utilizing fluorescence at a time of transition from a singlet exciton to a ground state, but also phosphorescence emission through a triplet exciton which is typified by "Improved energy transfer in electrophosphorescent device (D. F. O'Brien, et al., Applied Physics Letters Vol. 74, No. 3, p. 442 (1999))" and "Very high-efficiency green organic light-emitting devices based on electrophosphorescence (M. A. Baldo, et al., Applied Physics Letters Vol. 75, No. 1, p. 4 (1999))". In each of those documents, an organic layer having a four-layer structure is mainly used. The structure includes a hole transport layer, a light-emitting layer, an exciton diffusion blocking layer, and an electron transport layer in the stated order from an anode side. A phosphorescent light-emitting material contained in the above organic layers is a phosphorescent metal complex compound having Pt or Ir as its central metal, and Ir(ppy)$_3$ (ppy: phenylpyridine) is a representative example of this compound. A host such as a carbazole- or triazole-based compound is doped with a low concentration (about several percent) of this compound.

Meanwhile, a research on a polymer type organic electroluminescence device useful for large screen size and cost reduction (no use of mask) has also been actively advanced. A polymeric material to be used in the polymer type organic electroluminescence device cannot be vapor-deposited (sublimated), but is soluble in an organic solvent or the like, and therefore an application method such as a spin coating method, a printing method, or an ink jet method is adapted for the material. A shadow mask is indispensable to patterning by a vapor deposition (sublimation) method, and therefore the patterning involves a large problem in that the utilization efficiency of a material is about several percent. On the other hand, the application method has a high advantage that the utilization efficiency of a material reaches 100% because the application method requires no mask.

Researches on use of a phosphorescent metal complex compound even in such polymer type organic electroluminescence device have also been conducted. Most of the researches each relate to a device having a light-emitting layer containing, as a host, a carrier transport polymer (for example, polyvinyl carbazole) doped with a low concentration (about several percent) of a phosphorescent metal complex compound (for example, Ir(ppy)$_3$) (Nature, 347, 539 (1990)).

In addition, a group of University of Cambridge (Journal of the American Chemical Society, 126 (22), 7041 (2004)) has reported that Ir(ppy)$_3$ as a phosphorescent metal complex compound is formed into a polymer. Specifically, the document describes a device using, in its light-emitting layer, a phosphorescent metal complex compound having a ligand obtained by introducing polyfluorene (having 40 or less repeating units) into a phenyl group of phenylpyridine (ppy) described above. However, the external quantum efficiency of the device is as low as 1.5% at maximum.

In addition, a group of NHK (Applied Physics Letters, 86, 103507 (2005)) has reported a material of a type which is obtained by bonding Ir(ppy)$_2$acac (ppy: phenylpyridine, acac: acetylacetone) as a phosphorescent metal complex compound to a side chain of polyethylene. The concept of the above-mentioned material is different from that of the present invention, that is, "phosphorescent metal complex compound having no molecular weight distribution and a molecular weight which can be defined". However, an organic electroluminescence device using this material shows an external quantum efficiency of 11.8% as a relatively high efficiency.

Known examples of a mechanism by which the emission efficiency of such polymer type organic electroluminescence device as described above is controlled include energy transfer from the singlet or triplet excited state of a polymer host to a phosphorescent metal complex compound, and direct excitation on the phosphorescent metal complex compound. Therefore, one means for causing the phosphorescent metal complex compound to efficiently emit light is to satisfy the following conditions: the singlet or triplet energy level of the host is higher than that of the phosphorescent metal complex compound, and the band gap of the host is large. Further, for example, the following three points are extremely important factors for causing the compound to more efficiently emit light. That is, a first point is that the solubility of the host and the phosphorescent metal complex compound in a solvent is excellent. A second point is that phosphorescent metal complex compound molecules do not agglomerate or associate (static quenching) in a solution or a film. A third point is that collision between excited molecules and other molecules (dynamic quenching) is suppressed. In addition, a polymeric material has a molecular weight distribution, and the molecules of the material are not formed of a single component. Therefore, when the material is formed into a film, the material inevitably involves a problem that a defect or an impurity is observed in the film. This problem largely affects the long-term stability (life-time of the device) of the device, and is one cause for the fact that the life-time of a polymer type device is hardly comparable to that of a low weight molecular type device.

SUMMARY OF THE INVENTION

The present invention has been made in view of the above problems, and an object of the present invention is to provide an organic electroluminescence device using a novel phosphorescent metal complex compound and having high efficiency, high luminance, and high durability. Another object of the present invention is to provide an organic electroluminescence device that can be easily produced at a relatively low cost.

To solve the above problems, the inventors of the present invention have synthesized a phosphorescent metal complex compound based on the following concepts: (1) the compound is phosphorescent, (2) the compound has no molecular weight distribution (the molecular weight of the compound can be defined), (3) the solubility of the compound in a solvent is excellent, (4) the molecules of the compound do not agglomerate in a solution or a film, (5) the compound has high efficiency and high luminance even when no host is used, and (6) the compound has three functions, that is, a light-emitting function, a hole transport function, and an electron transport function. The inventors have found that an organic electroluminescence device having higher efficiency, high luminance, and high durability can be produced by using the compound. Thus, the inventors have completed the present invention.

That is, an organic electroluminescence device of the present invention includes: a pair of electrodes including an anode and a cathode; and one or more organic layers each containing an organic compound, the one or more organic layers being interposed between the pair of electrodes, wherein at least one of the one or more organic layers contains a phosphorescent metal complex compound having at least one ligand structure represented by the following general formula (1):

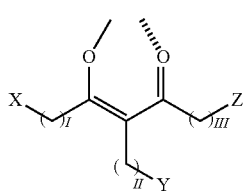

(1)

where at least one of X, Y and Z represents an aromatic oligomer having 13 or more carbon atoms and bonded directly or through a linking group, and X, Y and Z may be the same or different; the linking group includes a substituted or unsubstituted methylene group, a substituted or unsubstituted ethylene group, —O—, —S—, —CO—, —CO—O—, —O—CO—, —CH=CH—, —CO—N(-)-, —C≡C—, —N(-)-, —O-Ph-, or —O-Ph(-)- provided that Ph represents benzene; and the number of each of repeating units I, II and III is 0 or more and 5 or less.

An organic electroluminescence device using the phosphorescent metal complex compound of the present invention is an excellent device capable of not only emitting light with high efficiency but also maintaining high luminance for a long time period.

Further features of the present invention will become apparent from the following description of exemplary embodiments with reference to the attached drawings.

DESCRIPTION OF THE EMBODIMENTS

Figure 1A:
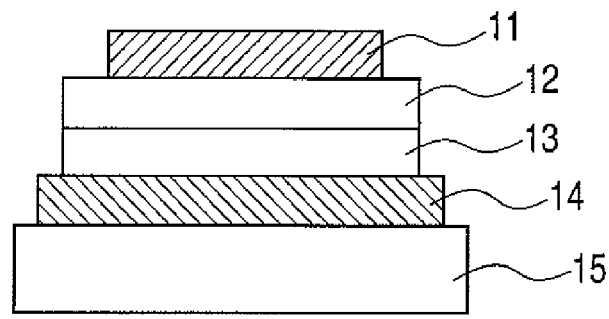
FIGS. 1A, 1B and 1C are views each illustrating an example of a light-emitting device of the present invention.

Hereinafter, the present invention will be described in detail.

First, a phosphorescent metal complex compound of the present invention will be described.

At least one ligand structure of the phosphorescent metal complex compound of the present invention is represented by the above general formula (1).

At least one of X, Y and Z in the formula (1) represents an aromatic oligomer having 13 or more carbon atoms and bonded directly or through a linking group; an aromatic ring as a repeating unit is a substituted or unsubstituted aryl group, or a substituted or unsubstituted heterocyclic ring.

Examples of the substituted or unsubstituted aryl include benzene, methylbenzene, ethylbenzene, t-butylbenzene, octylbenzene, chlorobenzene, iodobenzene, dimethylbenzene, diethylbenzene, diphenylaminobenzene, phenylbenzene, naphthalene, anthracene, phenanthrene, fluorene, acenaphthalene, azulene, heptacene, heptaphene, aceanthrylene, pyrene, perylene, 1,3-diphenylbenzene, pentacene, coronene, hexaphene, and chrysene.

Examples of the substituted or unsubstituted heterocycle include furane, thiophene, pyrrole, pyrroline, pyrrolidine, oxazole, isoxazole, thiazole, isothiazole, imidazole, imidazoline, imidazolidine, pyrazole, pyrazolidine, furazan, pyran, pyrene, pyridine, methylpyridine, ethylpyridine, bipyridine, piperidine, pyridazine, pyrimidine, pyrazine, piperazine, morpholine, indole, indoline, indazole, quinoline, isoquinoline, cinnoline, phthalazine, quinazoline, quinoxaline, naphthyridine, purine, pteridine, carbazole, acridine, phenanthroline, phenoxazine, and thianthrene.

When one or two of X, Y and Z in the general formula (1) represent an oligoaromatic group having 13 or more carbon atoms and bonded directly or through a linking group, the remaining two or one of X, Y and Z are not particularly limited, and may each independently represent, for example, a hydrogen atom, a halogen atom, a nitro group, a cyano group, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted heterocyclic group, a substituted or unsubstituted amino group, a substituted or unsubstituted carbonyl group, a substituted or unsubstituted ester group, or a substituted or unsubstituted carbamoyl group. Specific examples of those substituents are similar to those in the general formulae (2) to (4), and will be described in detail below.

The aromatic oligomer in the general formula (1) has a molecular weight of preferably 300 or more and 3,000 or less. A molecular weight of less than 300 may be unable to satisfy an object of the present invention, that is, a state where the phosphorescent metal complex compound of the present invention has high efficiency and high luminance even when no host is used because the concentration of light-emitting sites (metal concentration) in the entire molecules of the compound increases, whereby concentration quenching occurs. In addition, a molecular weight of less than 300 may provide an insufficient carrier transport function. On the other hand, a molecular weight in excess of 3,000 may be a factor for impairing the durability of an organic EL device using the compound to a large extent because it becomes difficult to purify (increase the purity of) the compound, and a problem such as the inclusion of an impurity or the presence of a molecular weight distribution occurs.

The aromatic oligomer in the above general formula (1) is preferably represented by any one of the following general formulae (2) to (4):

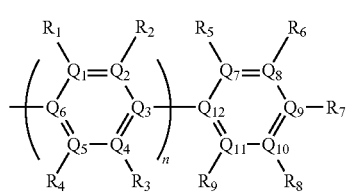

(2)

where $R_1$ to $R_9$ each represent a hydrogen atom, a halogen atom, a nitro group, a cyano group, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted heterocyclic group, a substituted or unsubstituted amino group, a substituted or unsubstituted carbonyl group, a substituted or unsubstituted ester group, or a substituted or unsubstituted carbamoyl group, and these substituents adjacent to each other may be bonded to form a ring; $Q_1$ to $Q_{12}$ each represent a carbon atom or a hetero atom; n represents an integer of 1 or more and 29 or less; and aromatic units as repeating units may be the same or different, and adjacent aromatic units may be linked with each other by a substituted or unsubstituted methylene group, a substituted or unsubstituted ethylene group, —O—, —S—, —N(-)-, or —CO—,

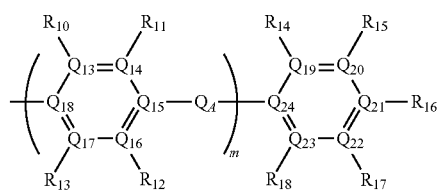

(3)

where $R_{10}$ to $R_{18}$ each represent a hydrogen atom, a halogen atom, a nitro group, a cyano group, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted heterocyclic group, a substituted or unsubstituted amino group, a substituted or unsubstituted carbonyl group, a substituted or unsubstituted ester group, or a substituted or unsubstituted carbamoyl group, and these substituents adjacent to each other may be bonded to form a ring; $Q_{13}$ to $Q_{24}$ each represent a carbon atom or a hetero atom; $Q_A$ represents a substituted or unsubstituted methylene group, a substituted or unsubstituted ethylene group, —O—, —S—, —CO—, —CO—O—, —O—CO—, —CH=CH—, —CO—N(-)-, —C≡C—, —N(-)-, —O-Ph-, or —O-Ph(-)- provided that Ph represents benzene; m represents an integer of 1 or more and 29 or less; and aromatic units as repeating units may be the same or different,

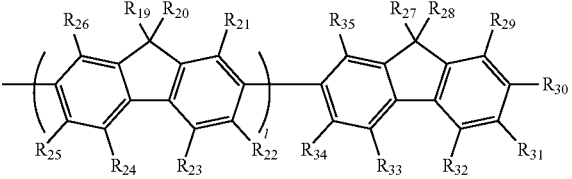

(4)

where $R_{19}$ to $R_{35}$ each independently represent a hydrogen atom, a halogen atom, a nitro group, a cyano group, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted heterocyclic group, a substituted or unsubstituted amino group, a substituted or unsubstituted carbonyl group, a substituted or unsubstituted ester group, or a substituted or unsubstituted carbamoyl group; l represents an integer of 1 or more and 19 or less; and aromatic units as repeating units may be the same or different.

The aromatic oligomer represented by the general formula (4) may include a fluorene unit in which all of $R_{19}$ to $R_{35}$ are the same as a repeating unit, or may use a fluorene unit in which $R_{19}$ to $R_{35}$ are different as a repeating unit.

The case where n or m represents 30 or more, or l represents 20 or more in any one of the general formulae (2) to (4) is not preferable because it becomes difficult to isolate a single molecule of the compound, and the performance of an organic EL device using the compound cannot be stably secured. In addition, the case where m, n, or l represents 0 is not preferable because the following inconvenience occurs: the solubility of the compound in a solvent is poor, the molecules of the compound are apt to agglomerate in a solution or a film, and high efficiency cannot be expected from an organic EL device using the compound.

Specific examples of the substituents in the general formulae (2) to (4) are shown below.

Examples of a substituted or unsubstituted alkyl group or cycloalkyl group include, but are not limited to: a methyl group; a methyl-d1 group; a methyl-d3 group; an ethyl group; an ethyl-d5 group; an n-propyl group; an n-butyl group; an n-pentyl group; an n-hexyl group; an n-heptyl group; an n-octyl group; an n-decyl group; an iso-propyl group; an iso-propyl-d7 group; an iso-butyl group; a sec-butyl group; a tert-butyl group; a tert-butyl-d9 group; an iso-pentyl group; a neopentyl group; a tert-octyl group; a fluoromethyl group; a difluoromethyl group; a trifluoromethyl group; a 2-fluoroethyl group; a 2,2,2-trifluoroethyl group; a perfluoroethyl group; a 3-fluoropropyl group; a perfluoropropyl group; a 4-fluorobutyl group; a perfluorobutyl group; a 5-fluoropentyl group; a 6-fluorohexyl group; a chloromethyl group; a trichloromethyl group; 2-chloroethyl group; a 2,2,2-trichloroethyl group; a 4-chlorobutyl group; a 5-chloropentyl group; a 6-chlorohexyl group; a bromomethyl group; a 2-bromoethyl group; an iodomethyl group; a 2-iodoethyl group; a hydroxymethyl group; a hydroxyethyl group; a cyclopropyl group; a cyclobutyl group; a cyclopentyl group; a cyclohexyl group; a cyclopentylmethyl group; a cyclohexylmethyl group; a cyclohexylethyl group; a 4-fluorocyclohexyl group; a norbornyl group; and an adamantyl group.

Further, examples of a substituted or unsubstituted aralkyl group include, but are not limited to: a benzyl group; a 2-phenylethyl group; a 2-phenylisopropyl group; a 1-naphthylmethyl group; a 2-naphthylmethyl group; a 2-(1-napthyl)ethyl group; a 2-(2-napthyl)ethyl group; a 9-anthrylmethyl group; a 2-(9-anthryl)ethyl group; a 2-fluorobenzyl group; a 3-fluorobenzyl group; a 4-fluorobenzyl group; a 2-chlorobenzyl group; a 3-chlorobenzyl group; a 4-chlorobenzyl group; a 2-bromobenzyl group; a 3-bromobenzyl group; and a 4-bromobenzyl group.

Examples of a substituted or unsubstituted alkenyl group or cycloalkenyl group include: a vinyl group; an allyl group (a 2-propenyl group); a 1-propenyl group; an iso-propenyl group; a 1-butenyl group; a 2-butenyl group; a 3-butenyl group; a styryl group; a cyclopentenyl group; a cyclohexenyl group; a cyclohexedienyl group; and a cyclooctenyl group.

Examples of a substituted or unsubstituted alkoxy group include: a methoxy group; an ethoxy group; a propoxy group; a 2-ethyl-octyloxy group; a phenoxy group; a 4-butylphenoxy group; and a benzyloxy group.

Examples of the substituted or unsubstituted aryl group or of the substituted or unsubstituted heterocyclic group include any one of the above-mentioned aryl and heterocyclic groups to be bonded as a substituent.

A substituted or unsubstituted amino group has a —NR$^1$R$^2$ structure. Examples of the R$^1$ and R$^2$ include, but are not limited to: a hydrogen atom; a deuterium atom; a substituted or unsubstituted alkyl group, alkenyl group, aralkyl group, aryl group, alkynyl group, alkylene group, alkenylene group, aralkylene group, arylene group, alkynelene group, or heterocyclic group. Examples of the substituted or unsubstituted amino group include, but are not limited to: an amino group; an N-methylamino group; an N-ethylamino group; an N,N-dimethylamino group; an N,N-diethylamino group; an N-methyl-N-ethylamino group; an N-benzylamino group; an N-methyl-N-benzylamino group; an N,N-dibenzylamino group; an anilino group; an N,N-diphenylamino group; an N-diphenylamino group; an N-phenyl-N-tolylamino group; an N,N-ditolylamino group; an N-methyl-N-phenylamino group; an N,N-dianisolylamino group; an N-mesityl-N-phenylamino group; an N,N-dimesitylamino group; an N-phenyl-N-(4-tert-butylphenyl)amino group; and an N-phenyl-N-(4-trifluoromethylphenyl)amino group.

Examples of the substituted or unsubstituted carbonyl group, the substituted or unsubstituted ester group, and the substituted or unsubstituted carbamoyl group include an acetyl group, a propionyl group, an isobutyryl group, a methacryloyl group, a benzoyl group, a naphthoyl group, an anthrayl group, a toloyl group, a methylester group, an ethylester group, an isopropylester group, a phenylester group, a phenylethylester group, a methylcarbamoyl group, an ethylcarbamoyl group, an isopropylcarbamoyl group, a phenylcarbamoyl group, and a phenylethylcarbamoyl group.

In addition, examples of a substituent which any one of those substituents may have include, but of course not limited to, such alkyl, alkenyl, aralkyl, aryl, alkynyl, alkylene, alkenylene, aralkylene, arylene, alkynylene, heterocyclic, amino, carbonyl, ester, and carbamoyl groups as described above, a halogen atom, a nitro group, and a cyano group.

Specific examples of the structural formula of the ligand represented by the general formula (1) are shown below. Of course, these examples are merely representative examples, and the present invention is not limited to the examples.

TABLE 1

| | X | Y | Z | I | II | III |
|---|---|---|---|---|---|---|
| 1 | —O—(C$_6$H$_4$)$_n$—C$_6$H$_5$, n = 6 | H | CH3 | 1 | 0 | 0 |
| 2 | CH$_3$CH$_2$—(C$_6$H$_4$)$_n$—C$_6$H$_5$, n = 6 | H | CH3 | 1 | 0 | 0 |
| 3 | CH$_3$O—C(=O)—(C$_6$H$_4$)$_n$—C$_6$H$_5$, n = 6 | H | CH3 | 1 | 0 | 0 |
| 4 | —O—(C$_6$H$_4$)$_n$—C$_6$H$_4$—N(C$_6$H$_5$)$_2$, n = 6 | H | CH3 | 1 | 0 | 0 |

TABLE 1-continued
| | X | Y | Z | I | II | III |
|---|---|---|---|---|---|---|
| 5 | 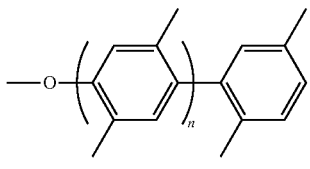 n = 6 | H | CH3 | 1 | 0 | 0 |
| 6 | CH3 | 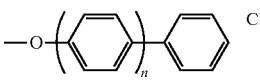 n = 6 | CH3 | 1 | 1 | 0 |
| 7 | 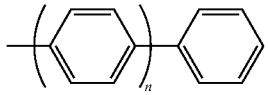 n = 2 | H | 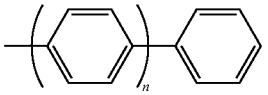 n = 2 | 1 | 0 | 1 |
| 8 |  n = 2 | H |  n = 2 | 2 | 0 | 2 |
| 9 |  n = 6 | H | 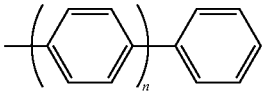 n = 6 | 1 | 0 | 1 |
| 10 |  n = 6 | H |  n = 6 | 1 | 0 | 1 |
| 11 | 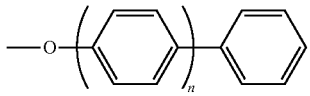 n = 6 | 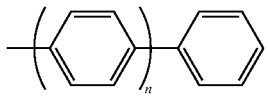 n = 6 | CH3 | 1 | 1 | 0 |
| 12 | 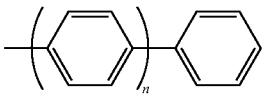 n = 10 | H | 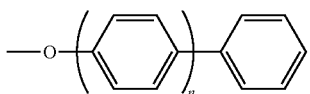 n = 10 | 1 | 0 | 1 |
| 13 | 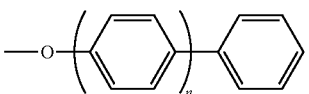 n = 10 | H | 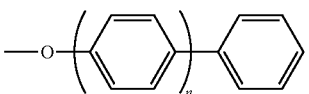 n = 10 | 1 | 0 | 1 |

TABLE 2

| | X | Y | Z | I | II | III |
|---|---|---|---|---|---|---|
| 14 | 9,9-dimethylfluorene | 9,9-dimethylfluorene | H | 1 | 0 | 1 |
| 15 | 9-methyl-9-trifluoromethylfluorene | 9-methyl-9-trifluoromethylfluorene | H | 1 | 0 | 1 |
| 16 | 9,9-dimethylfluorenyloxy | 9,9-dimethylfluorenyloxy | H | 1 | 0 | 1 |
| 17 | 9-methyl-9-trifluoromethylfluorenyloxy | 9-methyl-9-trifluoromethylfluorenyloxy | H | 1 | 0 | 1 |
| 18 | 4-(7-phenyl-9,9-dimethylfluoren-2-yl)phenoxy | 4-(7-phenyl-9,9-dimethylfluoren-2-yl)phenoxy | H | 1 | 0 | 1 |
| 19 | extended fluorene-biphenyl-fluorene-phenyl system | extended fluorene-biphenyl-fluorene-phenyl system | H | 1 | 0 | 1 |

TABLE 2-continued

| | X | Y | Z | | I | II | III |
|---|---|---|---|---|---|---|---|
| 20 | (structure) | H | (structure) | | 0 | 0 | 0 |
| 21 | (structure) | H | (structure) | | 1 | 0 | 1 |
| 22 | (structure) | H | (structure) | | 1 | 0 | 1 |
| 23 | (structure) | H | (structure) | | 1 | 0 | 1 |
| 25 | (structure) | H | (structure) | | 1 | 0 | 1 |

TABLE 2-continued

| X | Y | Z | I | II | III |
|---|---|---|---|---|---|
| 26 | (structure: bis-fluorene with F3C groups, n=4, linked to phenyl-O-) | H | (structure: bis-fluorene with F3C groups, n=4, linked to phenyl-O-) | 1 | 0 | 1 |
| 27 | (structure: bis-fluorene with C8H17 groups, n=4, linked to phenyl-O-) | H | (structure: bis-fluorene with C8H17 groups, n=4, linked to phenyl-O-) | 1 | 0 | 1 |

TABLE 3
| | X | Y | Z | I | II | III |
|---|---|---|---|---|---|---|
| 28 | 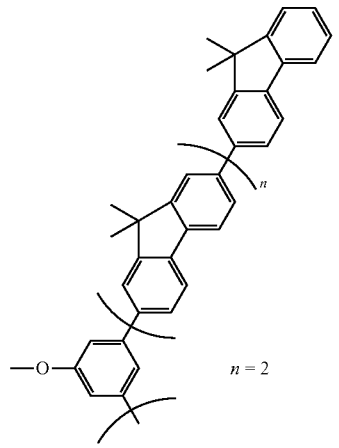 n = 2 | H | CH3 | 0 | 0 | 0 |
| 29 | 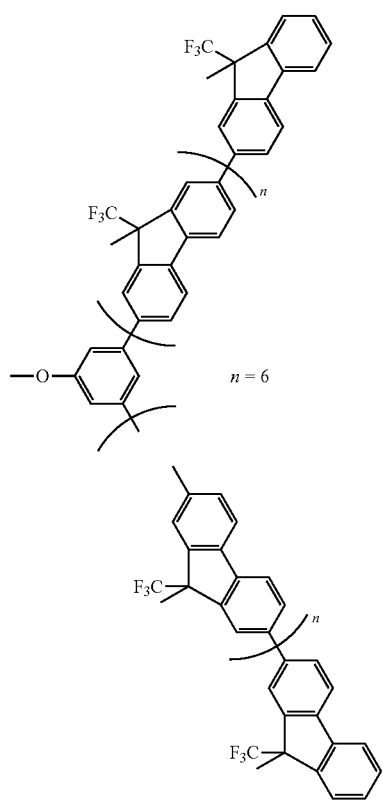 n = 6 | H | CH3 | 1 | 0 | 0 |

TABLE 3-continued
| | X | Y | Z | I | II | III |
|---|---|---|---|---|---|---|
| 30 | 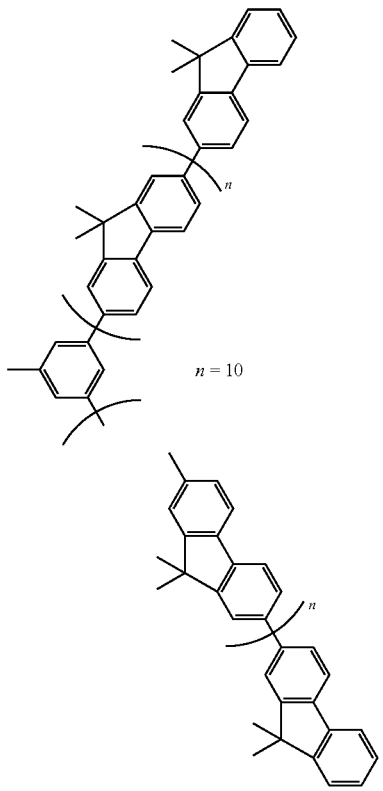 n = 10 | H | CH3 | 1 | 0 | 0 |
| 31 | 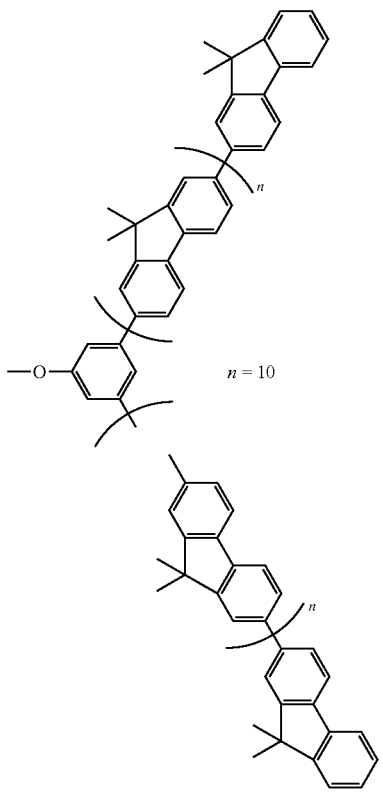 n = 10 | H | CH3 | 1 | 0 | 0 |

TABLE 4

| X | Y | Z | | I | II | III |
|---|---|---|---|---|---|---|
| 33 [structure: diphenylamino-difluorene-phenyl-methoxy, n=4] | H | CH3 | | 1 | 0 | 0 |
| 34 [structure: bithiophene-phenyl-methoxy, n=6] | H | [structure: dimethylfluorene-fluorene-phenyl-methoxy, n=4] | | 1 | 0 | 1 |
| 35 [structure: bis-EDOT-phenyl-methoxy, n=6] | H | [structure: dimethylfluorene-fluorene-phenyl-methoxy, n=4] | | 1 | 0 | 1 |
| 36 [structure: bipyridine-phenyl-methoxy, n=6] | H | [structure: dimethylfluorene-fluorene-phenyl-methoxy, n=4] | | 1 | 0 | 1 |
| 37 [structure: terpyridine-phenyl-methoxy, n=3] | H | [structure: dimethylfluorene-fluorene-phenyl-methoxy, n=4] | | 1 | 0 | 1 |

TABLE 4-continued

| X | Y | Z | I | II | III |
|---|---|---|---|---|---|
| 38 | | | 10 | 0 | 1 |
| 39 | | | 10 | 0 | 1 |
| 40 | | H | 10 | 0 | 1 |
| 41 | | H | 10 | 0 | 1 |
| 42 | | H | 10 | 0 | 1 |

TABLE 4-continued

| X | Y | Z | I | II | III |
|---|---|---|---|---|---|
| 43 | H | (structure: bis-benzothiadiazole-phenyl-OMe, n=6) | (structure: bis-dimethylfluorene-phenyl-OMe, n=4) | 10 | 0 | 1 |

In the phosphorescent metal complex compound of the present invention, a ligand except the ligand represented by the general formula (1) is not particularly limited. A known ligand such as 2-phenylpyridine, difluorophenylpyridine, phenylisoquinoline, fluorenopyridine, or fluorenoquinoline can be suitably used.

In addition, the central metal of the compound can be a metal atom selected from alkali metals, alkali earth metals, and rare earth metals. Ir, Pt, Ru, Re, Rh, or Cu can be used for obtaining higher efficiency and higher luminance, and Ir or Pt is most preferable.

A ratio of the atomic weight of the metal of the phosphorescent metal complex compound of the present invention to the molecular weight of the phosphorescent metal complex compound (hereinafter, "metal atomic weight/molecular weight") is preferably 0.1 or less. When the ratio "metal atomic weight/molecular weight" exceeds 0.1, the concentration of the metal in the entire molecules of the compound becomes so large that the so-called concentration quenching in which the phosphorescence intensity of the compound reduces may occur.

In addition, the phosphorescent metal complex compound of the present invention is preferably soluble in an organic solvent or water because an organic layer can be formed by an application method.

Specific examples of the structural formula of the phosphorescent metal complex compound of the present invention are shown below. Of course, these examples are merely representative examples, and the present invention is not limited to the examples. Compounds (44) to (53) each correspond to an example in which Ligand 10 described above is introduced, Compounds (54) to (63) each correspond to an example in which Ligand 21 described above is introduced, and Compounds (64) to (71) each correspond to an example in which Ligand 28 described above is introduced.

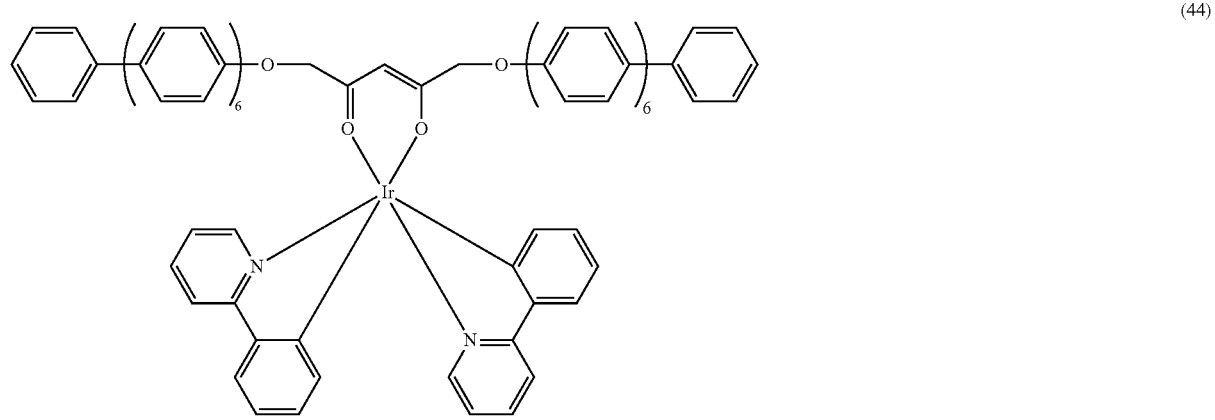

(44)

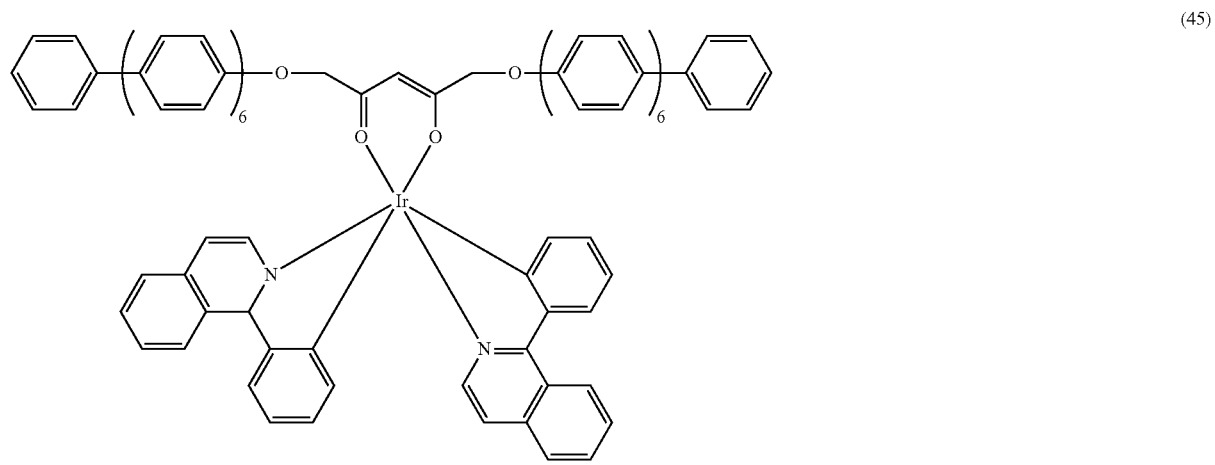

(45)

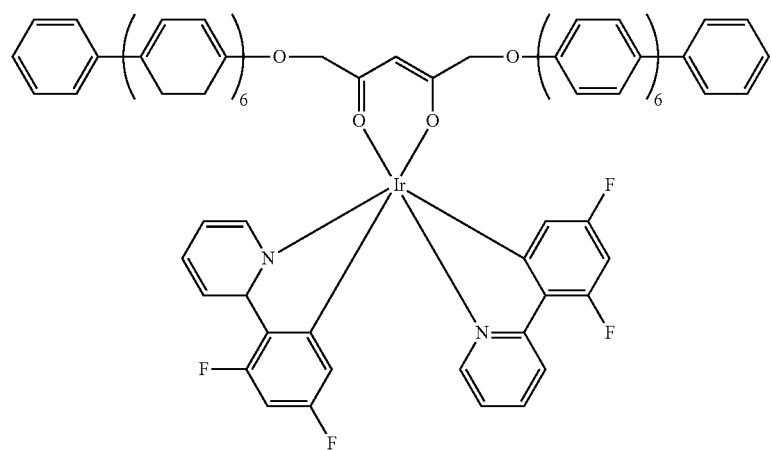
(46)
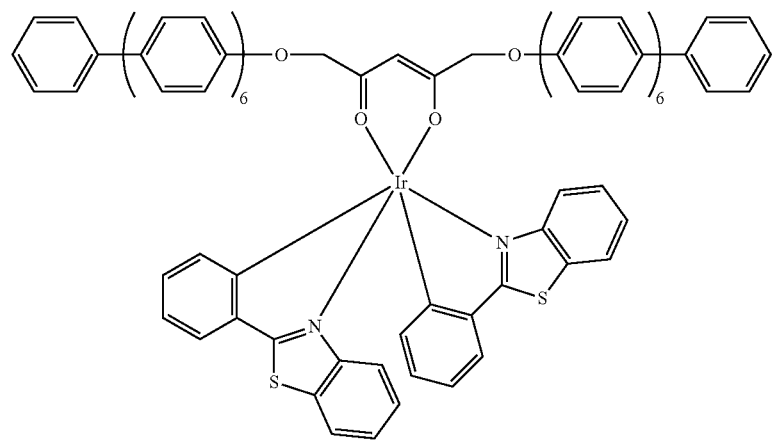
(47)
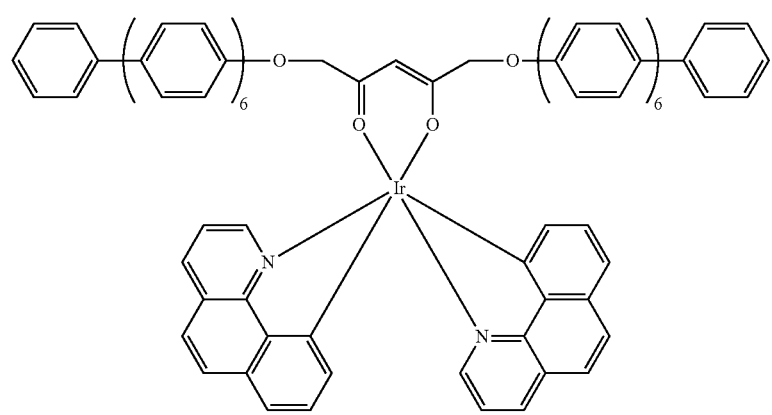
(48)

-continued
(49)
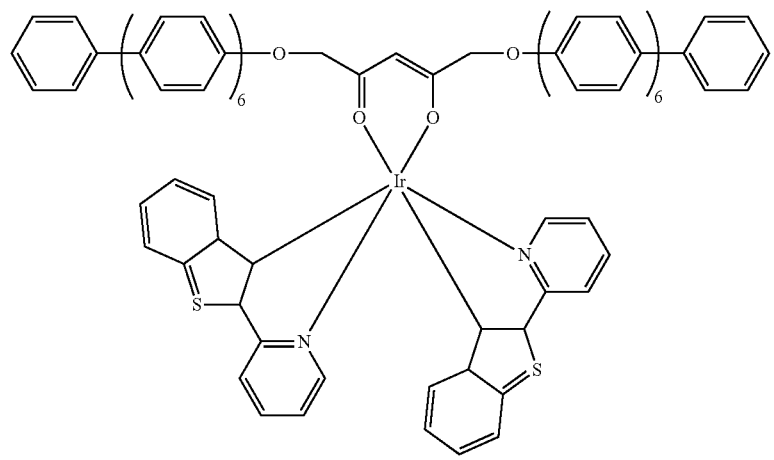
(50)
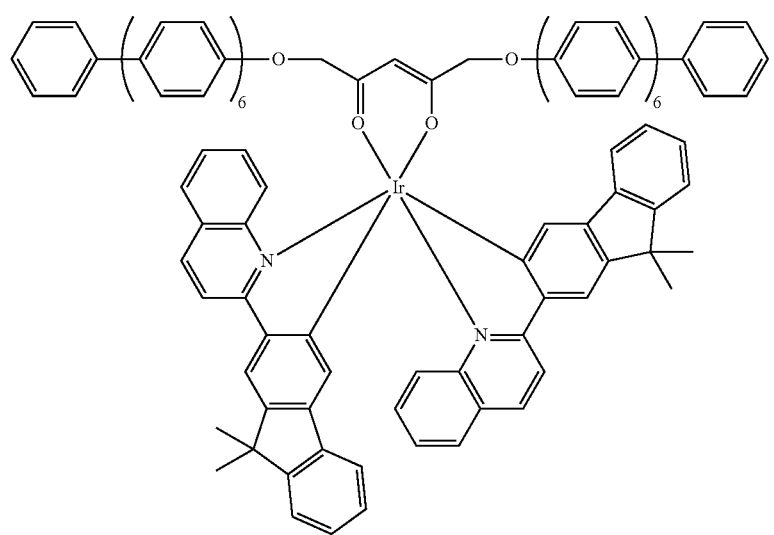
(51)
(52)
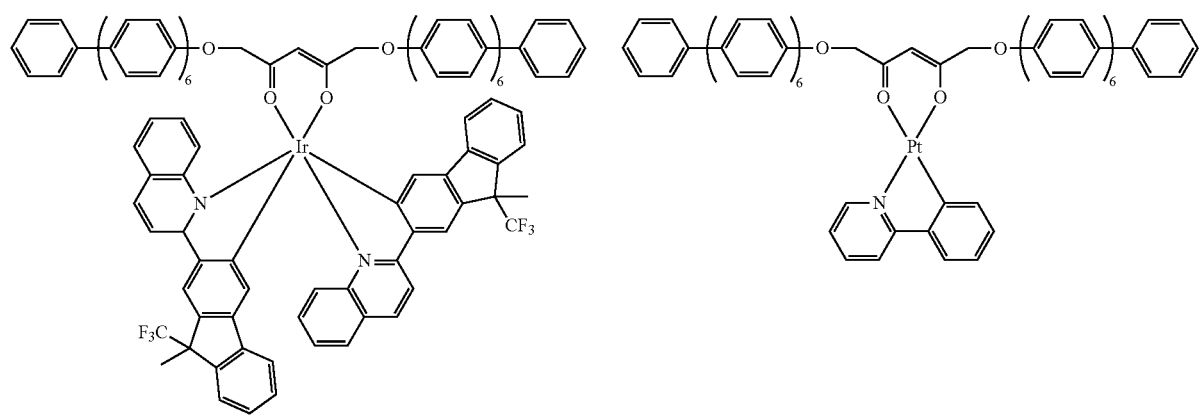

-continued
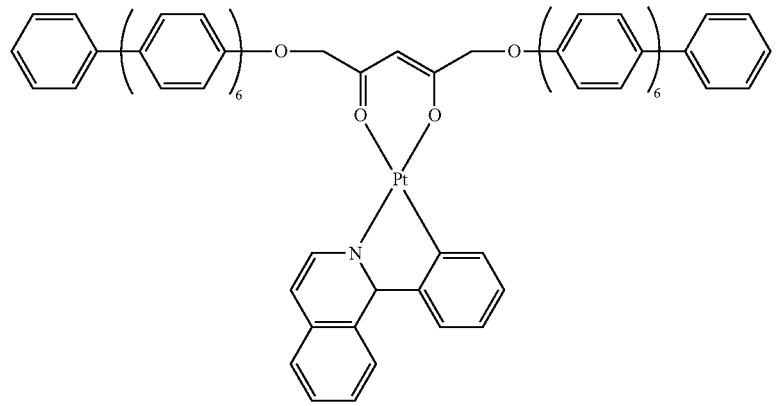
(53)
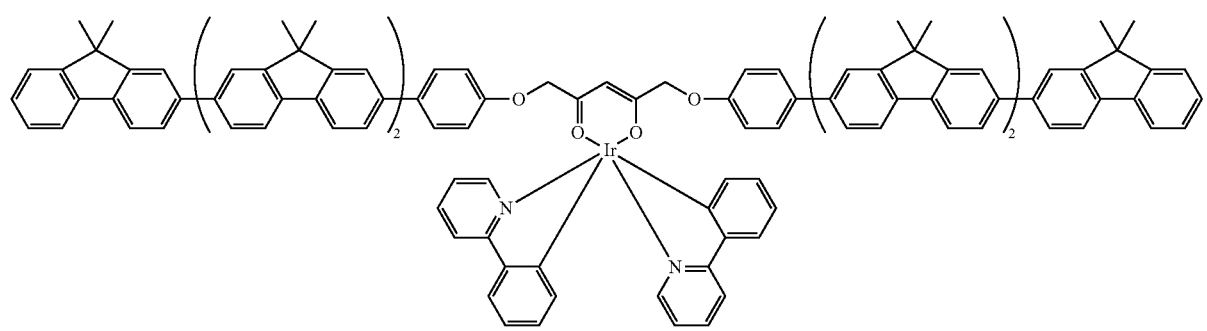
(54)
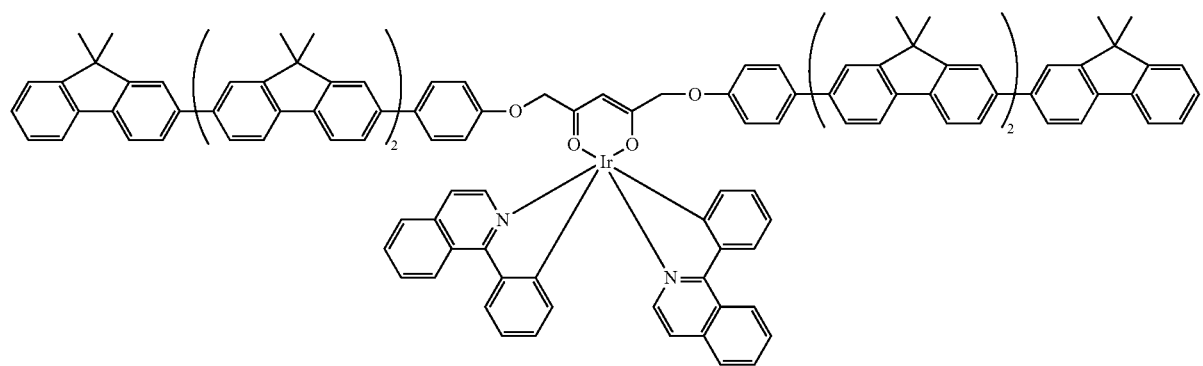
(55)
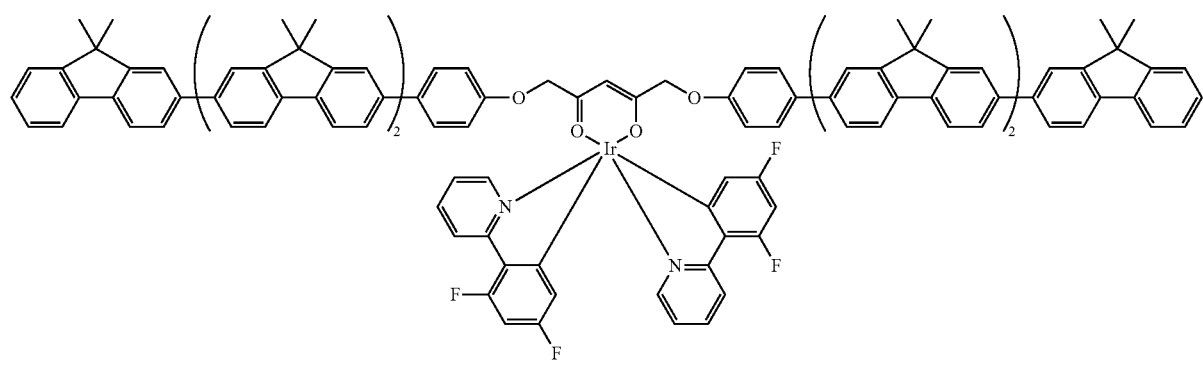
(56)

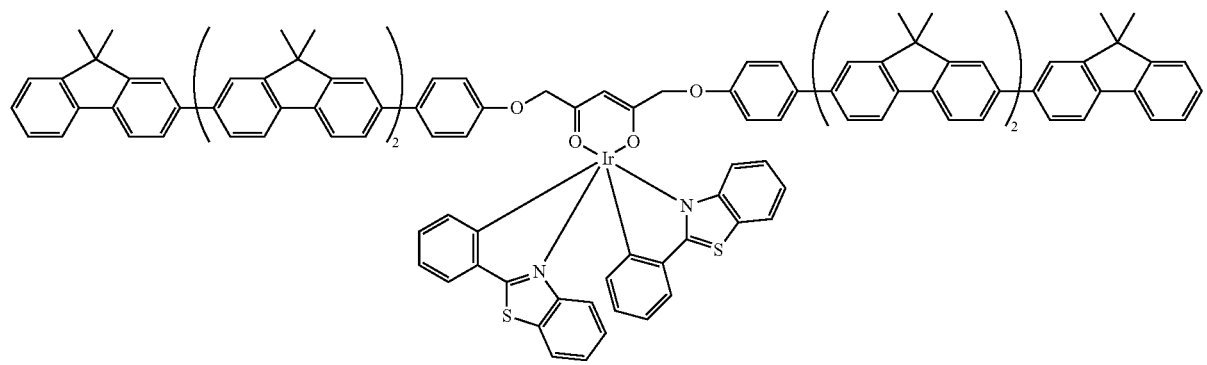
(57)
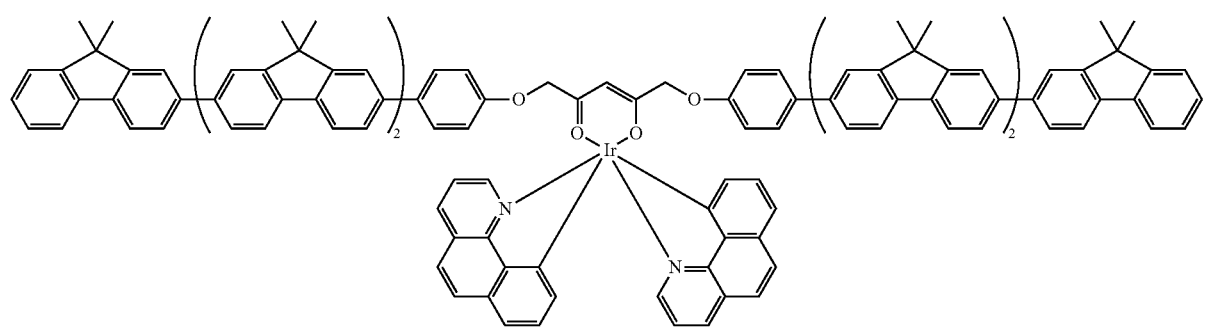
(58)
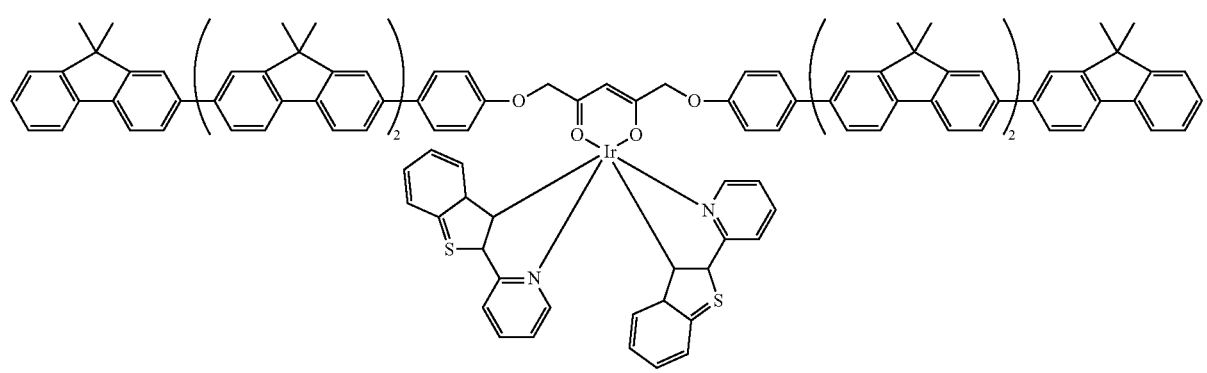
(59)
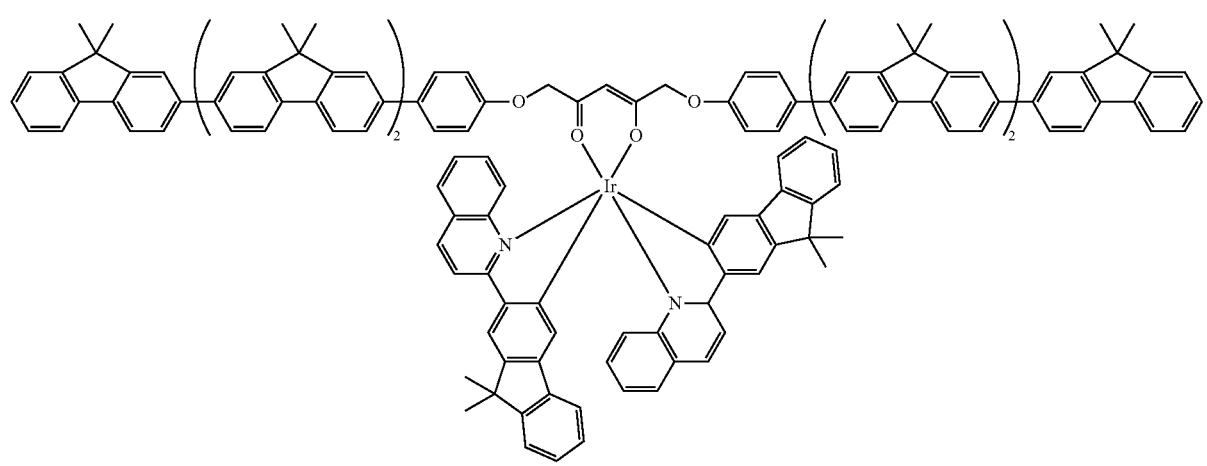
(60)

-continued
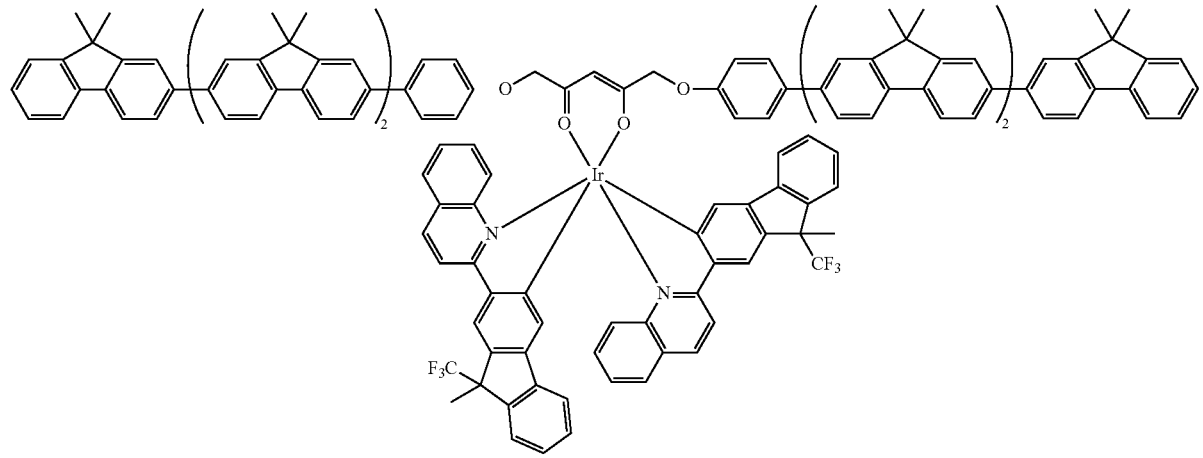
(61)
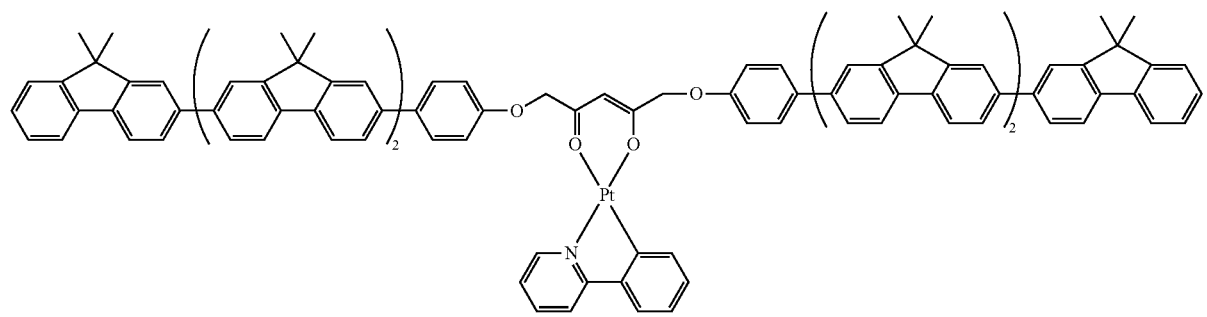
(62)
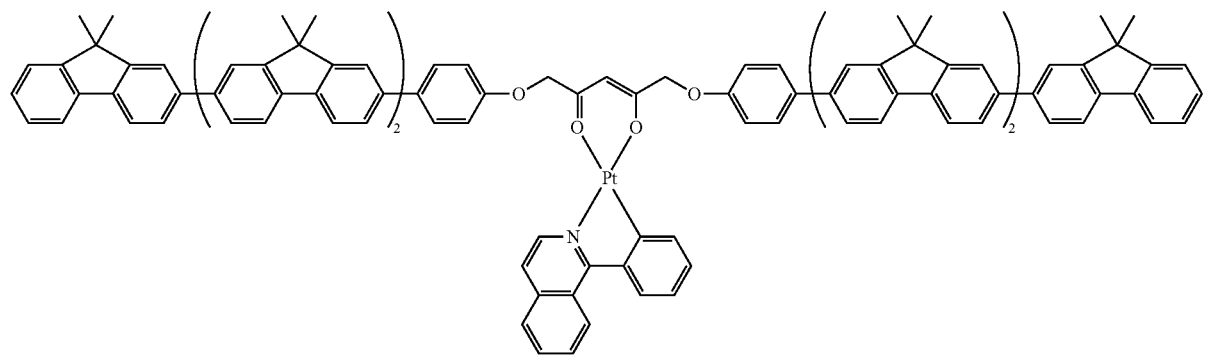
(63)

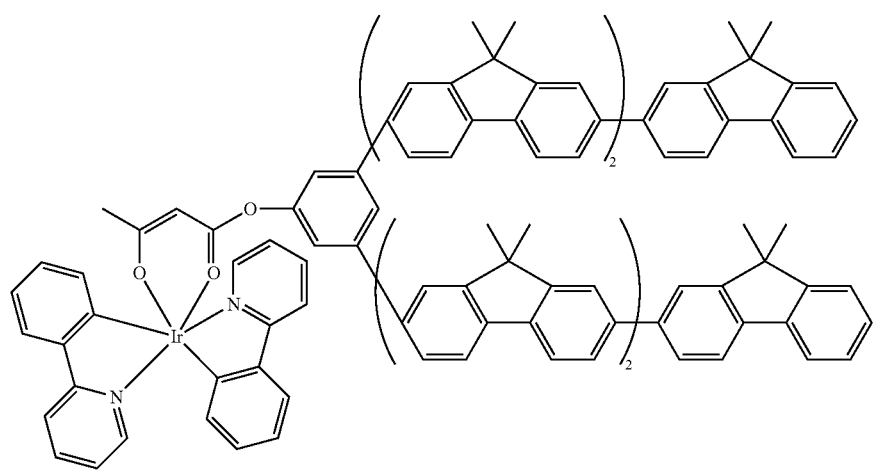
(64)
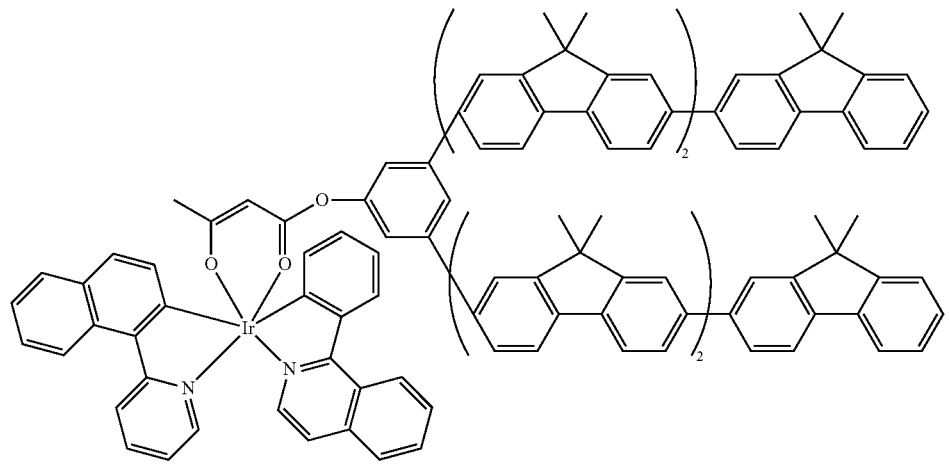
(65)
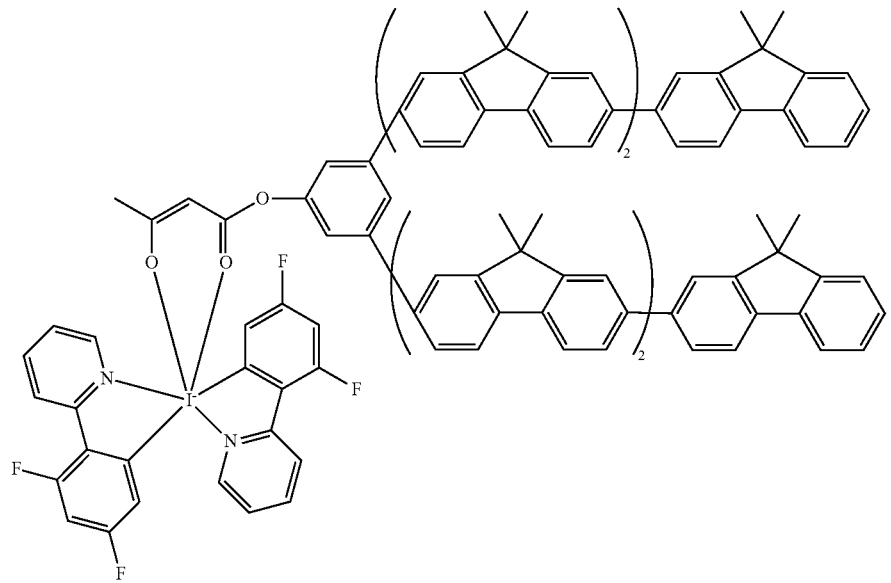
(66)

-continued
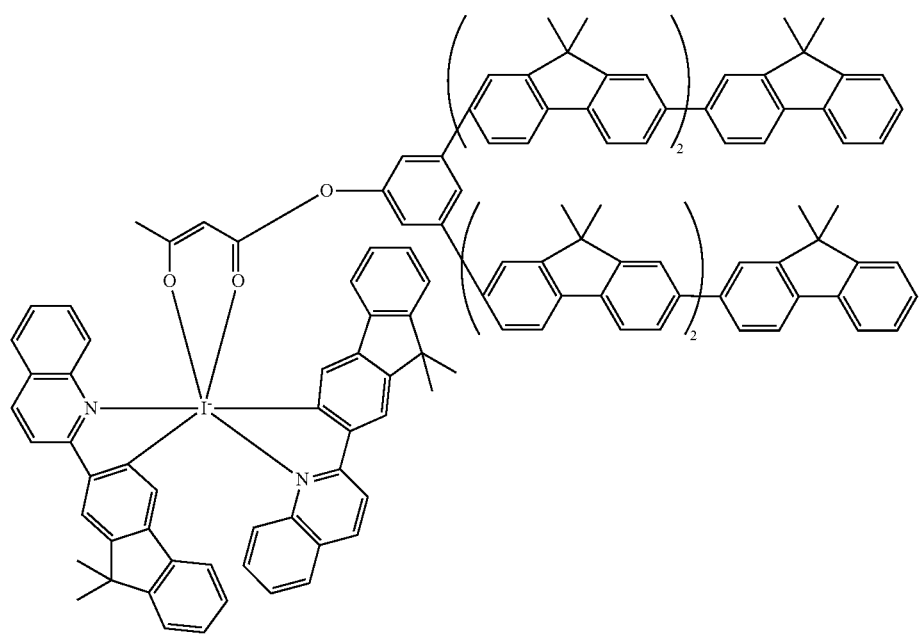
(67)
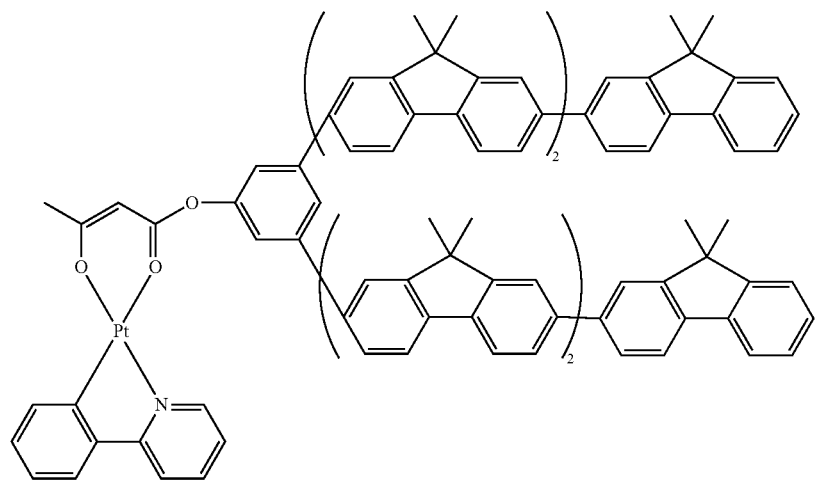
(68)
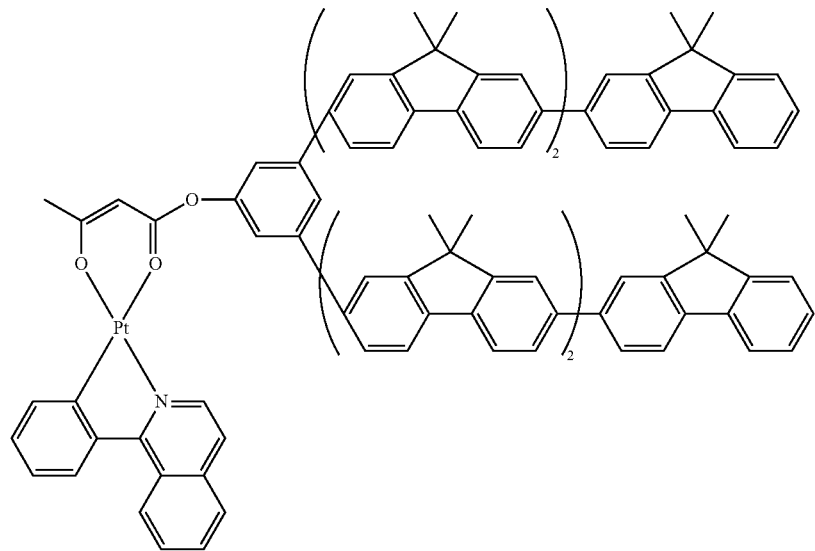
(69)

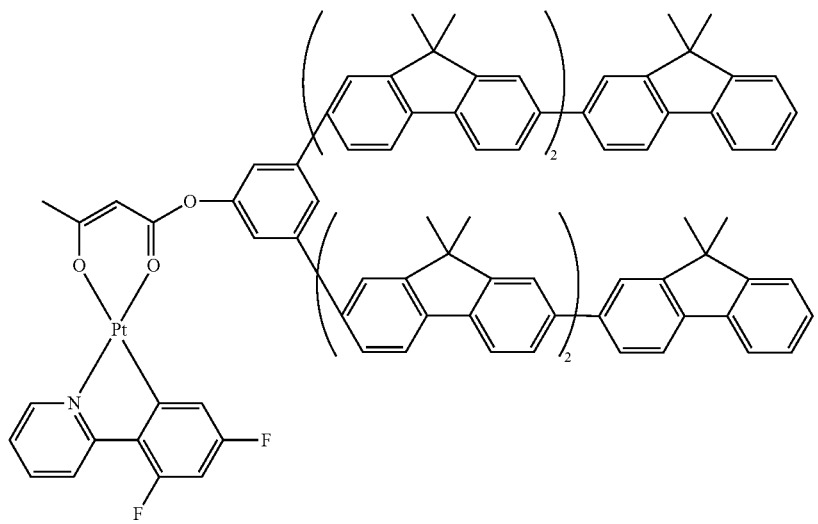

(70)

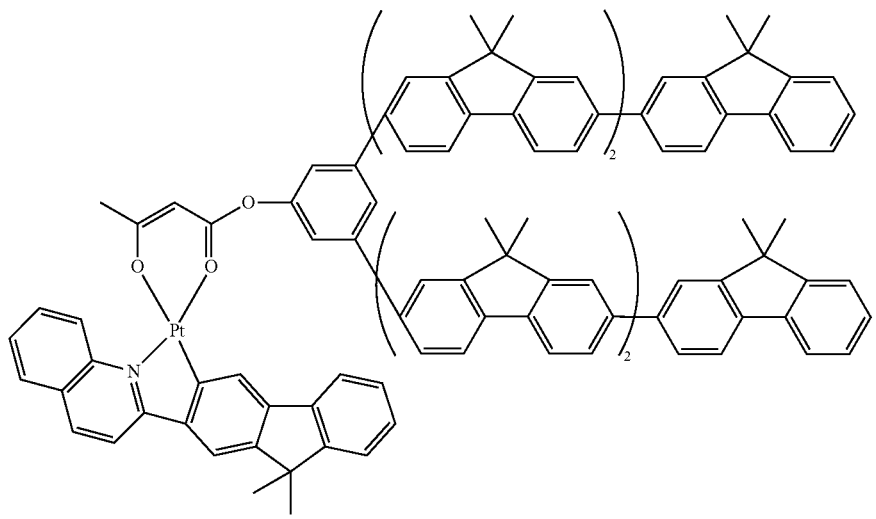

(71)

A method of synthesizing the phosphorescent metal complex compound of the present invention is not particularly limited. For example, the compound can be easily synthesized by introducing an oligoaromatic group into an acetylacetone (acac) derivative by an existing coupling reaction. Examples of a coupling method include a Suzuki coupling method involving the use of a palladium catalyst (for example, Chem. Rev., 95, 2457 (1995)), a Yamamoto method involving the use of a nickel catalyst (for example, Bull. Chem. Soc. Jap., 51, 2091 (1978)), and a method involving the use of an aryltin compound (for example, J. Org. Chem., 52, 4296 (1987)).

Figure 1B:
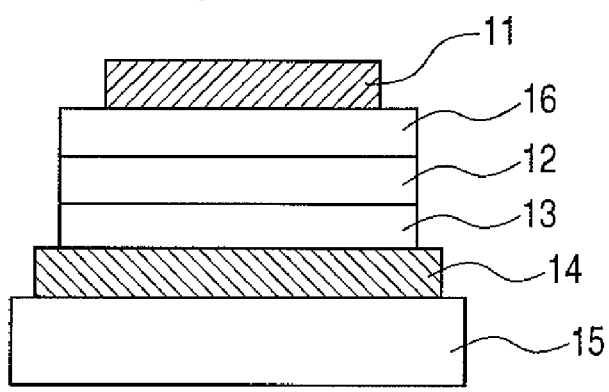
Figure 1C:
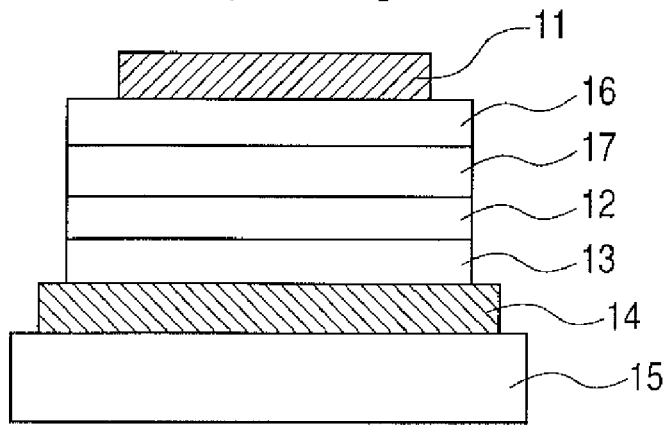

An organic electroluminescence device of the present invention has: a pair of electrodes including an anode and a cathode; and one or more organic layers each containing an organic compound, the one or more organic layers being interposed between the pair of electrodes. FIGS. 1A, 1B and 1C each show the basic device constitution of the present invention.

Here, the reference numerals of the figures will be described.

Reference numeral 11 represents a metal electrode; 12, a light-emitting layer; 13, a hole transport layer; 14, a transparent electrode; 15, a transparent substrate; 16, an electron transport layer; and 17, an exciton diffusion blocking layer.

As shown in FIGS. 1A, 1B and 1C, an organic EL device generally includes: a transparent substrate 15; a transparent electrode 14 having a thickness of 50 nm or more and 200 nm or less on the transparent substrate 15; a plurality of organic layers on the transparent electrode 14; and a metal electrode 11 for interposing the plurality of organic layers between the transparent electrode 14 and the metal electrode 11.

FIG. 1A shows an example in which the organic layers include a light-emitting layer 12 and a hole transport layer 13.

ITO having a large work function is used for the transparent electrode 14, so that a hole can be easily injected from the transparent electrode 14 to the hole transport layer 13. A metal material having a small work function such as aluminum, magnesium, or an alloy using any one of them is used for the metal electrode 11, so that electrons can be easily injected to the organic layers. The phosphorescent metal complex compound of the present invention is included in the light-emitting layer 12 and a polyethylenedioxythiophene/polystyrenesulfonate (PDOT/PSS), for example, can be used for the hole transport layer 13.

The device having the structure as described above exhibits electrical rectifying property. When an electric field is applied so that the metal electrode 11 becomes a cathode and the transparent electrode 14 becomes an anode, an electron is injected from the metal electrode 11 to the light-emitting layer 12, while a hole is injected from the transparent electrode 14 to the light-emitting layer 12. The injected hole and electron are recombined in the light-emitting layer 12 to generate an exciton, thereby causing light emission. At this time, the hole transport layer 13 serves as an electron blocking layer. As a result, recombination efficiency at an interface between the light-emitting layer 12 and the hole transport layer 13 increases to thereby increase the emission efficiency.

Further, in FIG. 1B, an electron transport layer 16 is provided between the metal electrode 11 and the light-emitting layer 12 shown in FIG. 1A. A light-emitting function and electron/hole transporting functions are separated to establish a more effective carrier blocking structure, whereby the emission efficiency is increased. An oxadiazole derivative, a phenanthroline derivative, or an Al quinolinol complex can be used for the electron transport layer 16.

As shown in FIG. 1C, a four-layer structure including the hole transport layer 13, the light-emitting layer 12, the exciton diffusion blocking layer 17, and the electron transport layer 16 in the stated order from the side of the transparent electrode 14 as the anode can also be employed for improving emission efficiency by confining the excition in the light-emitting layer 12.

An organic layer containing the phosphorescent metal complex compound of the present invention may contain any other compound; the organic layer is preferably an organic layer including only the phosphorescent metal complex compound of the present invention having sites capable of expressing a light-emitting function, a hole transport function, and an electron transport function. When the organic layer contains any other compound, the content of the phosphorescent metal complex compound of the present invention is not particularly limited.

In addition, at least one organic layer, in particular, an organic layer containing the phosphorescent metal complex compound of the present invention is preferably formed by an application method.

A high-efficiency light-emitting device described in the present invention is applicable to a product requiring energy savings and high luminance. Potential applications of the device include a display apparatus, a light source for a printer, a lighting system, and a backlight for a liquid crystal display apparatus. A possible example of the display apparatus is a flat panel display that achieves energy savings, high visibility, and a light weight. In addition, with regard to the light source for a printer, a laser light source portion of a laser beam printer that is now in widespread use can be replaced by the light-emitting device of the present invention. For example, an image is formed by placing, on an array, devices that can be independently addressed, and subjecting a photosensitive drum to desired exposure. The volume of an apparatus using the device of the present invention can be significantly reduced. In the case of the lighting system or the backlight, an energy-saving effect can be expected from the present invention.

A display apparatus of the present invention is obtained by combining the organic electroluminescence device of the present invention and a thin-film transistor, and is driven according to a passive matrix system or an active matrix system.

Hereinafter, an example in which an active matrix substrate is used in the device of the present invention will be described with reference to FIGS. 2, 3 and 4.

Figure 2:
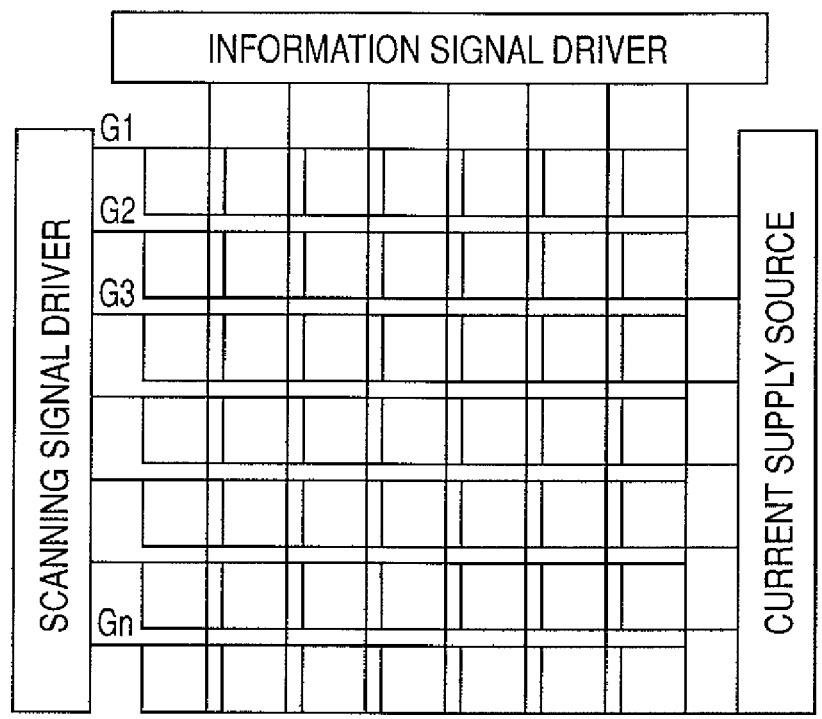
FIG. 2 is a view schematically illustrating an example of the constitution of a panel provided with an EL device and a driving unit.
Figure 3:
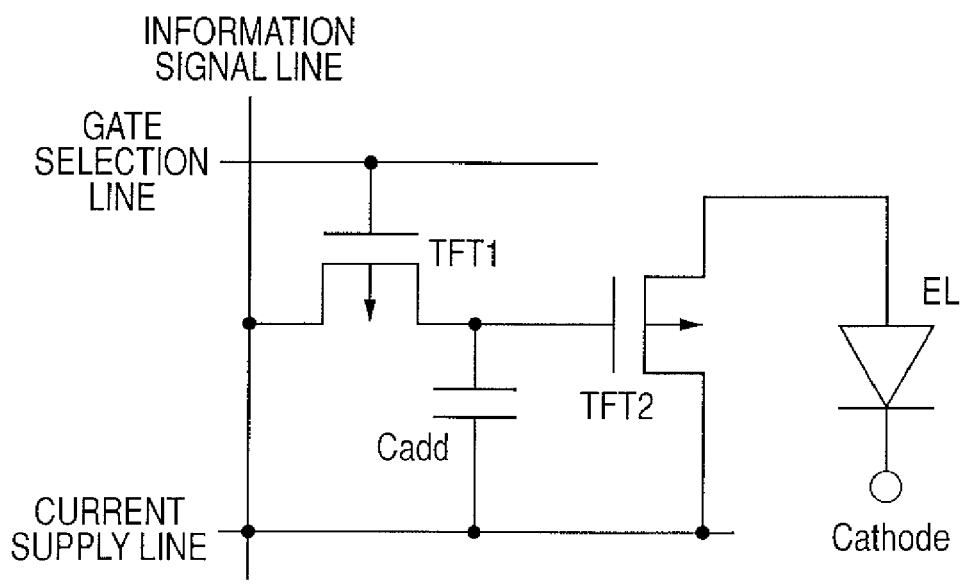
FIG. 3 is a view illustrating an example of a pixel circuit.

FIG. 2 schematically shows an example of the constitution of a panel provided with an EL device and a driving unit. A scanning signal driver, an information signal driver, and a current supply source are placed on the panel, and are connected to gate selection lines, information signal lines, and current supply lines, respectively. A pixel circuit shown in FIG. 3 is placed at the point of intersection of a gate selection line and an information signal line. The scanning signal driver selects gate selection lines G1, G2, G3, . . . , Gn sequentially, and an image signal is applied from the information signal driver in synchronization with the selection.

Next, the operation of the pixel circuit will be described. When a selection signal is applied to the gate selection line in the pixel circuit, a TFT 1 is turned on, an image signal is supplied to a Cadd, and the gate potential of a TFT 2 is determined. A current is supplied from the current supply line to the EL device in accordance with the gate potential of the TFT 2. Since the gate potential of the TFT 2 is kept in the Cadd until the TFT 1 is subjected to the next scanning selection, the current continues to flow in the EL device by the next scanning. As a result, the EL device can be caused to emit light at all times during one frame period.

Figure 4:
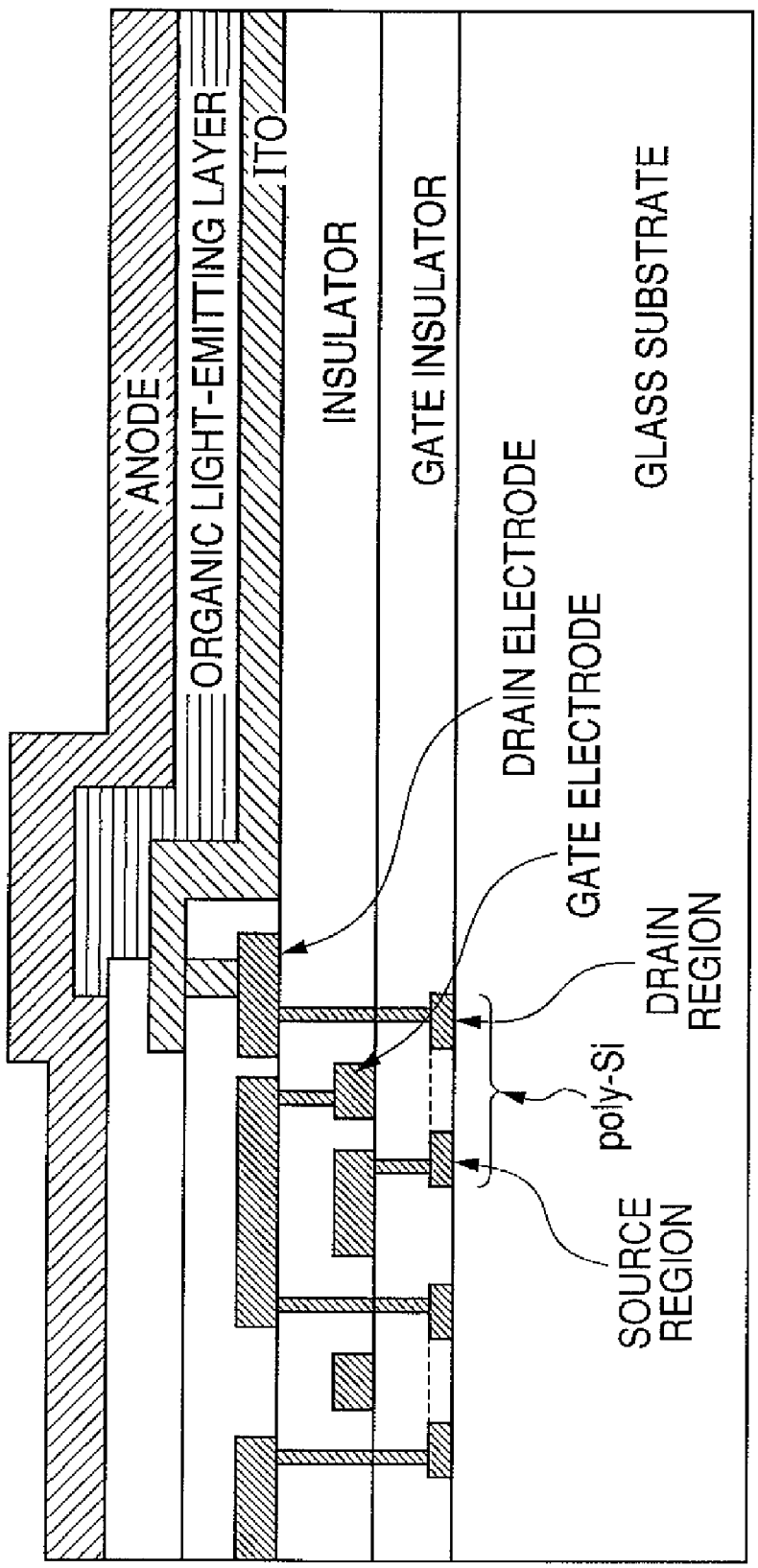
FIG. 4 is a schematic view illustrating an example of the sectional structure of a TFT substrate.

FIG. 4 is a schematic view showing an example of the sectional structure of a TFT substrate to be used in the present invention. A p-Si layer is provided on a glass substrate, and each of channel, drain, and source regions is doped with a necessary impurity. A gate electrode is provided on the layer with a gate insulating film interposed between the electrode and the layer, and a drain electrode to be connected to the drain region and a source electrode to be connected to the source region are formed. An insulating layer and an ITO electrode as a pixel electrode are stacked on the electrodes, and the ITO electrode and the drain electrode are connected with each other through a contact hole.

The application of the present invention is not particularly limited to a switching device, and the present invention is easily applicable to, for example, a single crystal silicon substrate, an MIM device, or an a-Si type device.

An organic EL display panel can be obtained by sequentially stacking one or more organic EL layers and a cathode layer on the ITO electrode. An image with good image quality can be stably displayed for a long time period by driving a display panel using the organic compound of the present invention.

Hereinafter, the present invention will be described specifically by way of examples, provided that the present invention is not limited to these examples.

The phosphorescent metal complex compounds used in the examples are shown below. Compound 1 is a compound into which Ligand 20 described above is introduced, and Compounds 2 and 3 correspond to Compound (55) and Compound (67) described above, respectively.

Compound 1
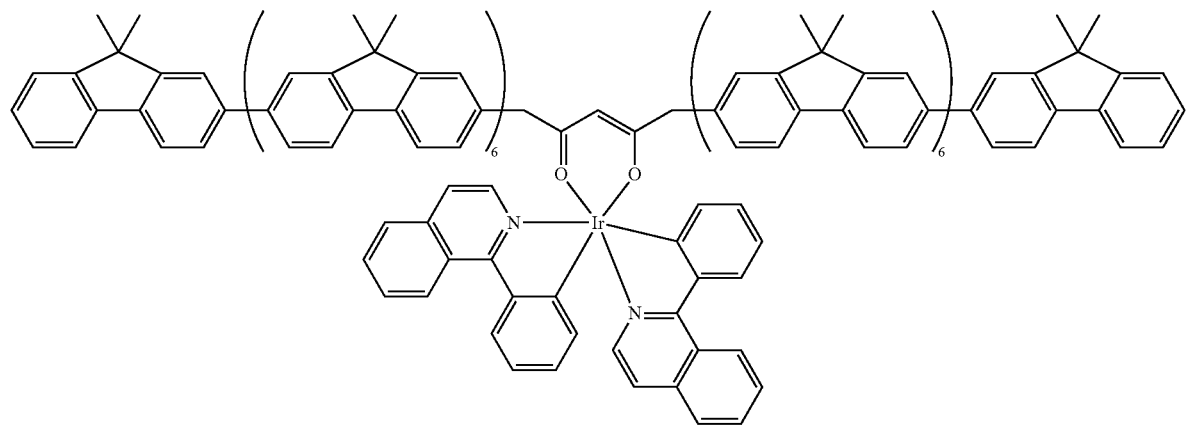
Compound 2
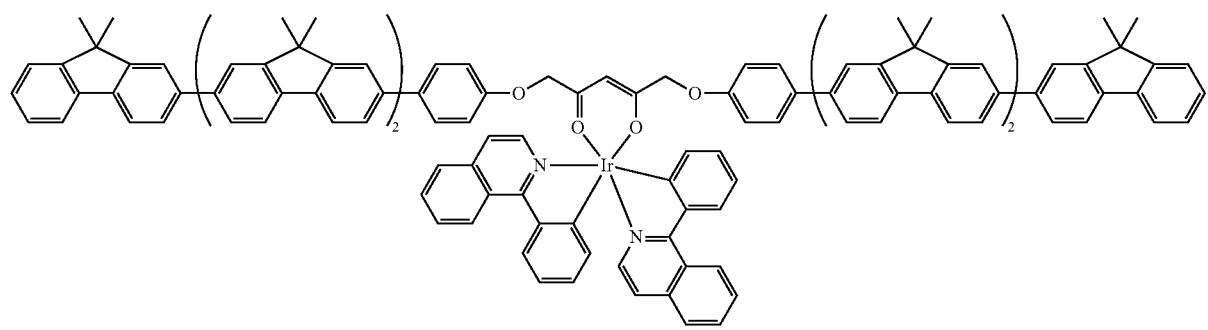
Compound 3
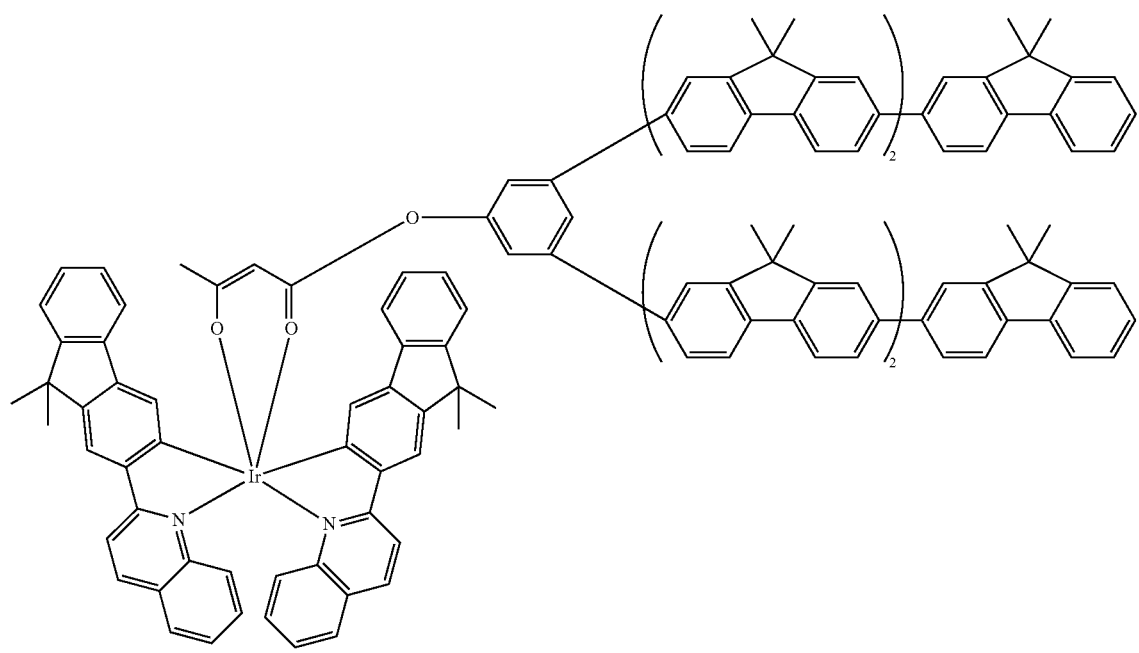

EXAMPLE 1

Synthesis of Compound 1

First, (B1) as an Ir complex precursor was synthesized in accordance with Scheme A and Scheme B.

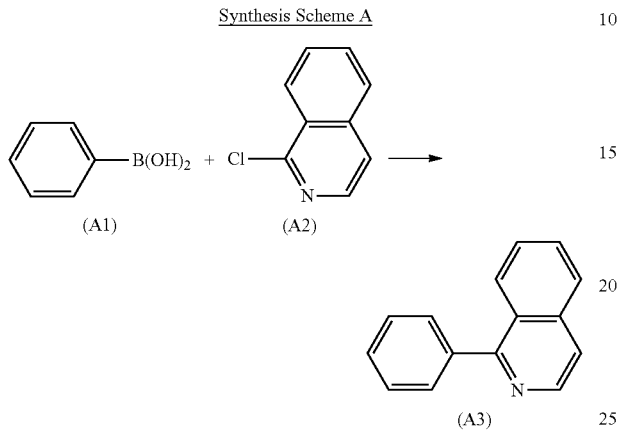

Synthesis Scheme A 3.0 g of (A1), 4.8 g of (A2), 0.2 g of tetrakistriphenylphosphine palladium, 20 ml of a 2 M aqueous solution of sodium carbonate, 10 ml of ethanol, and 20 ml of toluene were loaded into a 200 ml egg plant flask, and the mixture was stirred under heating reflux in a nitrogen stream for 4 hours. The reaction solution was poured into 80 ml of cold water, and 50 ml of toluene were added to the mixture, followed by liquid separation. An organic layer was isolated, and was then condensed. The resultant solid product was purified with a silica gel column (eluent: toluene) and recrystallized with hexane, whereby 2.1 g of the crystal of Compound (A3) were obtained.

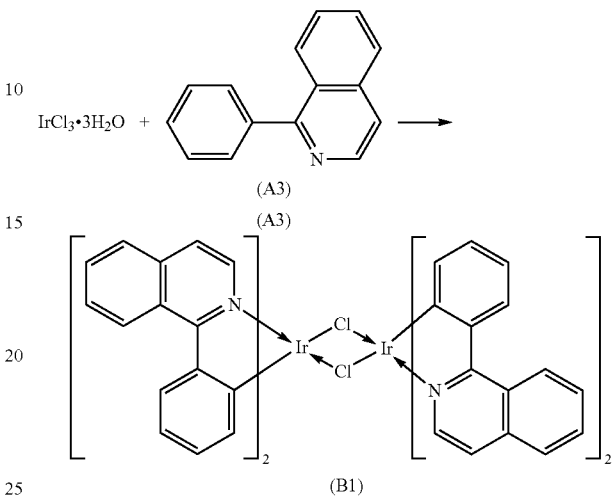

Synthesis Scheme B

Next, 0.77 g of iridium(III) trihydrate, 1.5 g of (A3), 20 ml of ethoxyethanol, and 6 ml of water were loaded into a 200-ml three-necked flask, and the mixture was stirred in a nitrogen stream at room temperature for 30 minutes. After that, the resultant was stirred under reflux for 10 hours. The reactant was cooled to room temperature, and the precipitate was obtained by filtration and cleaned with water. After that, the precipitate was cleaned with ethanol. The precipitate was dried at room temperature under reduced pressure, whereby 0.97 g of the red powder of (B1) was obtained.

Synthesis Scheme C

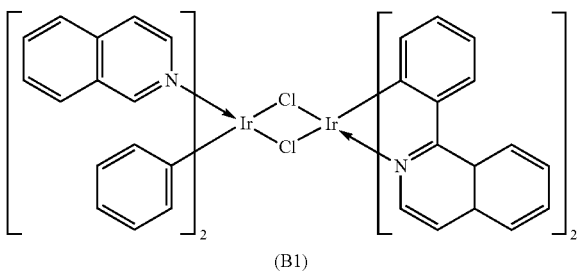

+

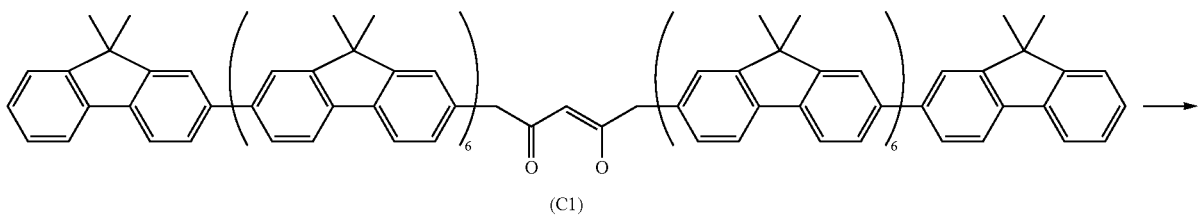

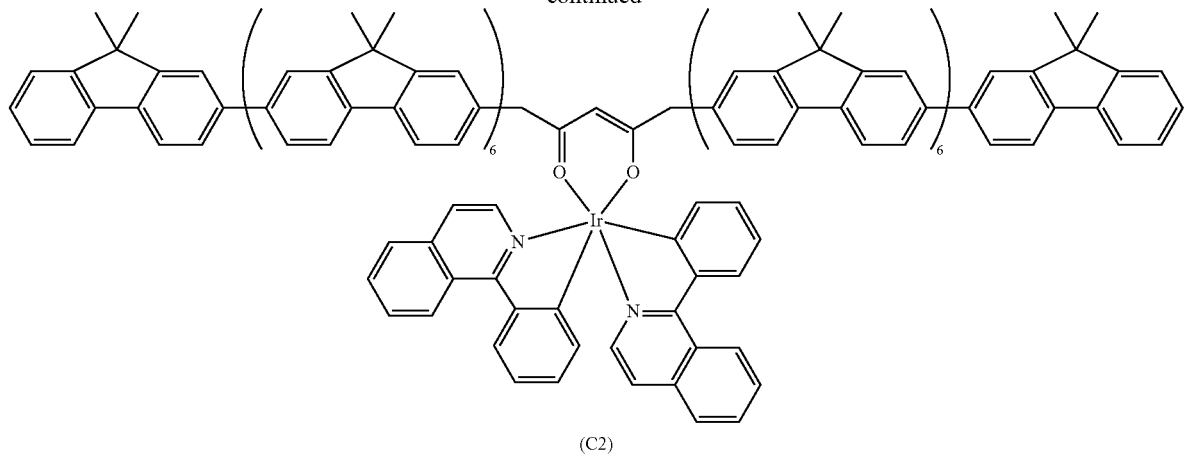

(C2)

Further, 100 ml of ethoxyethanol, 1.0 g of (B1), 4.1 g of an acetylacetone derivative (C1), and 0.7 g of sodium carbonate were loaded into a 200-ml three-necked flask, and the mixture was stirred in a nitrogen stream at room temperature for 1 hour. After that, the mixture was stirred under reflux for 24 hours. The reactant was cooled with ice, and the precipitate was obtained by filtration and cleaned with water. The precipitate was cleaned with ethanol and dissolved in chloroform, and then insoluble matter was filtrated. After having been condensed, the filtrate was recrystallized with chloroform-methanol, whereby 0.65 g of the reddish brown powder of (C2), that is, Compound 1 was obtained.

The emission spectrum of a solution of this compound in toluene had a λmax of 620 nm.

EXAMPLE 2

Synthesis of Compound 2

Synthesis Scheme D

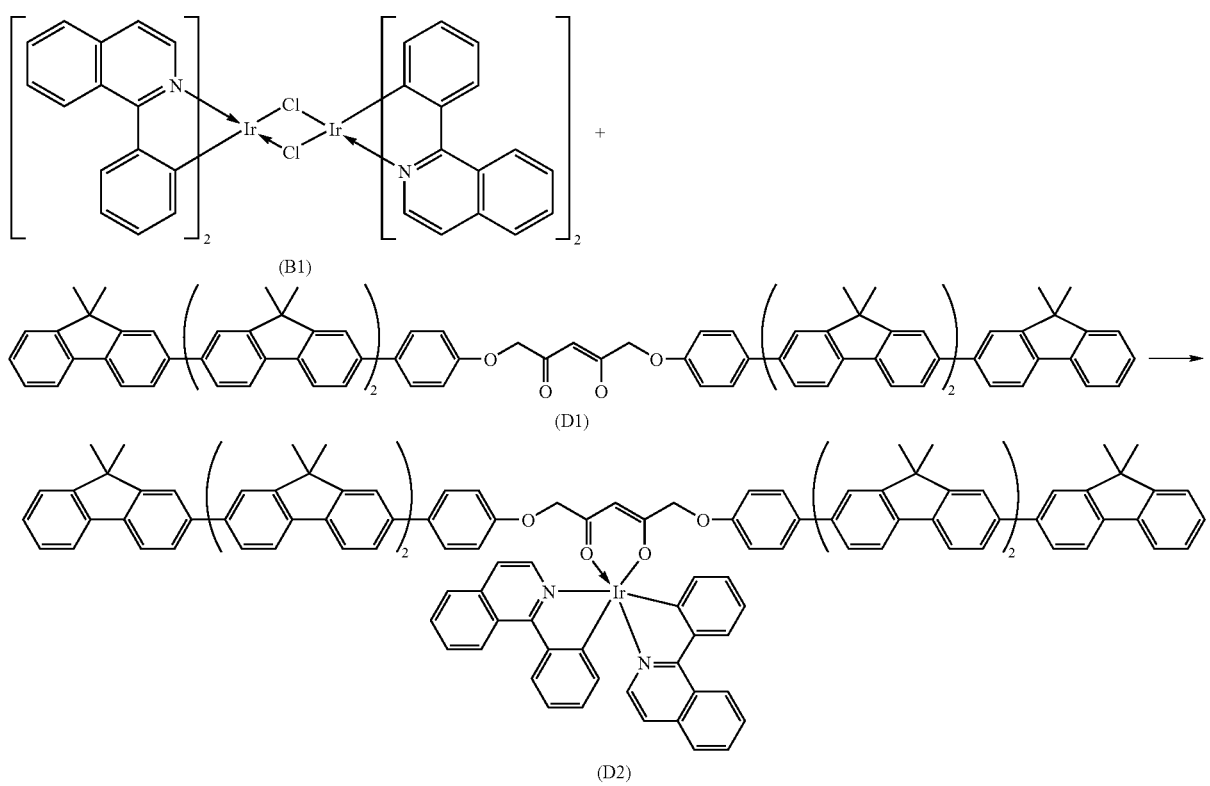

Further, 100 ml of ethoxyethanol, 1.0 g of (B1), 5.0 g of an acetylacetone derivative (C1), and 0.7 g of sodium carbonate were loaded into a 200-ml three-necked flask, and the mixture was stirred in a nitrogen stream at room temperature for 1 hour. After that, the mixture was stirred under reflux for 24 hours. The reactant was cooled with ice, and the precipitate was obtained by filtration and cleaned with water. The precipitate was cleaned with ethanol and dissolved in chloroform, and then insoluble matter was filtrated. After having been condensed, the filtrate was recrystallized with chloroform-methanol, whereby 0.45 g of the reddish brown powder of (D2), that is, Compound 2 was obtained.

The emission spectrum of a solution of this compound in toluene had a λmax of 620 nm.

EXAMPLE 3

Synthesis of Compound 3

First, (F1) as an Ir complex precursor was synthesized in accordance with Scheme E and Scheme F.

Synthesis Scheme E

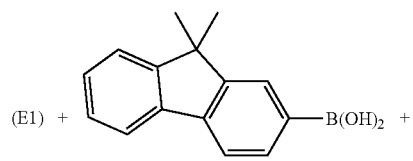

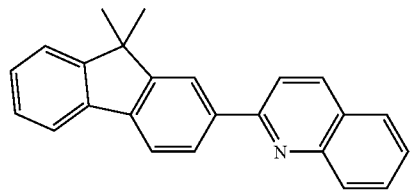

4.7 g of (E1), 3.3 g of (E2), 0.22 g of tetrakistriphenylphosphine palladium, 20 ml of a 2 M aqueous solution of sodium carbonate, 10 ml of ethanol, and 20 ml of toluene were loaded into a 200-ml egg plant flask, and the mixture was stirred under heating reflux in a nitrogen stream for 6 hours. The reaction solution was poured into 100 ml of cold water, and 50 ml of toluene were added to the mixture, followed by liquid separation. An organic layer was isolated, and was then condensed. The resultant solid product was purified with a silica gel column (eluent: toluene) and recrystallized with hexane, whereby 5.3 g of the crystal of Compound (E3) were obtained.

Synthesis Scheme F

IrCl$_3$·3H$_2$O +

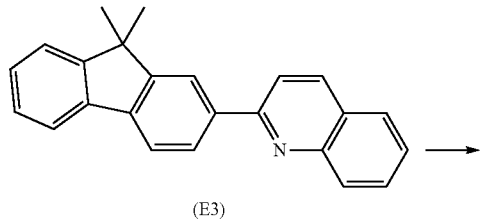

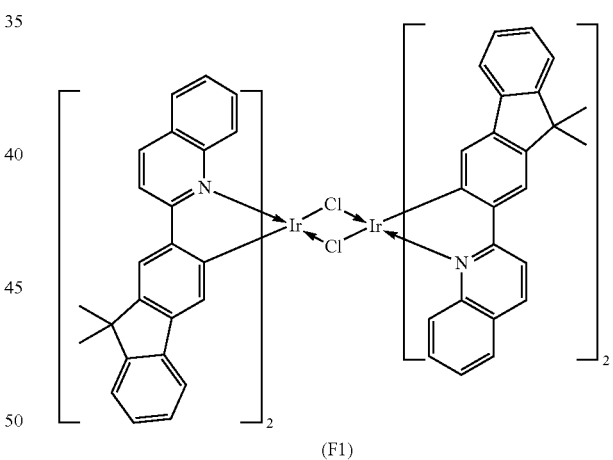

Next, 0.17 g of iridium(III) trihydrate, 2.8 g of (E3), 90 ml of ethoxyethanol, and 30 ml of water were loaded into a 200-ml three-necked flask, and the mixture was stirred in a nitrogen stream at room temperature for 30 minutes. After that, the mixture was stirred under reflux for 10 hours. The reactant was cooled to room temperature, and the precipitate was obtained by filtration and cleaned with water. After that, the precipitate was cleaned with ethanol. The precipitate was dried at room temperature under reduced pressure, whereby 1.56 g of the red powder of (F1) were obtained.

Synthesis Scheme G

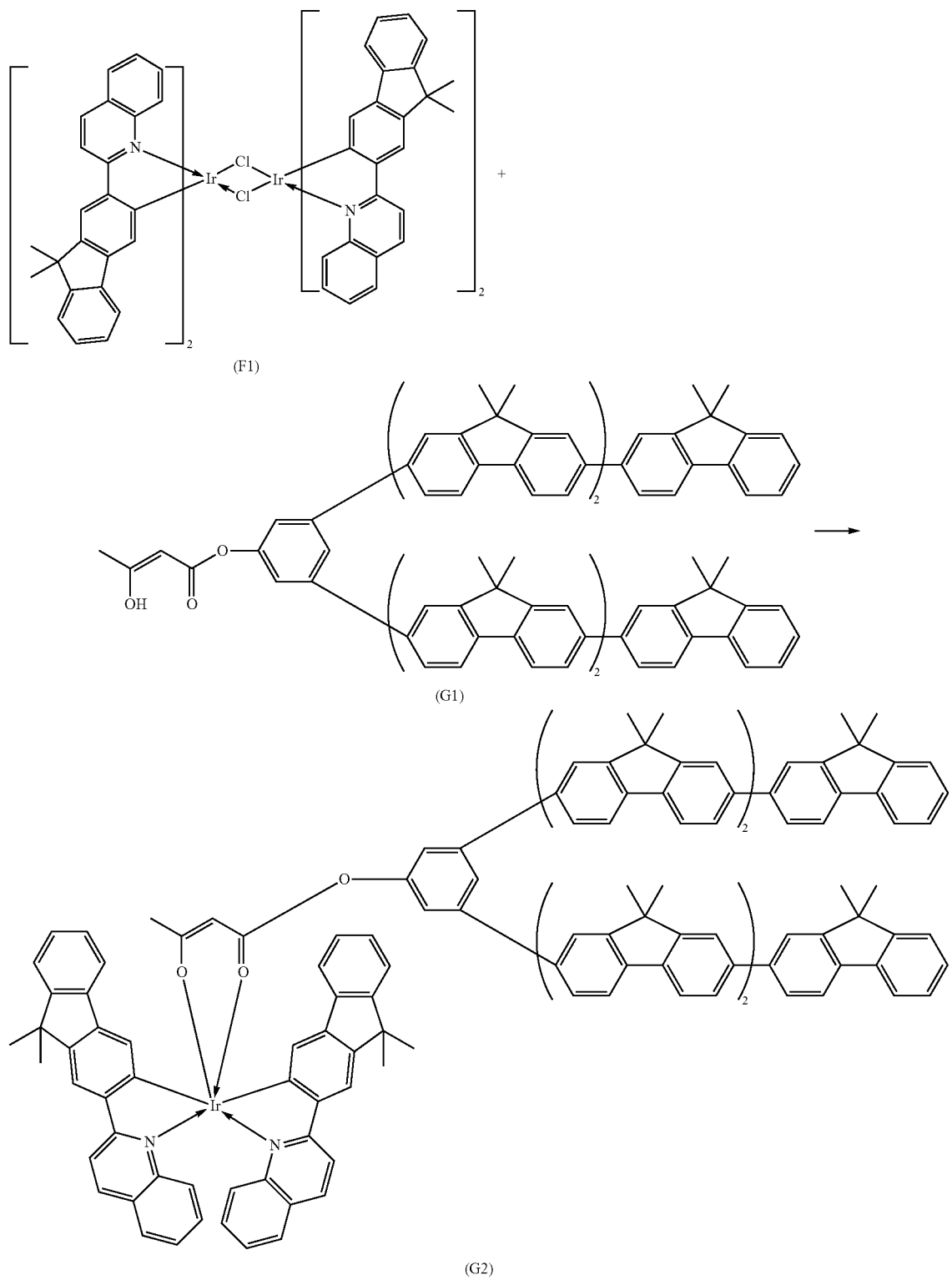

Further, 100 ml of ethoxyethanol, 1.3 g of (F1), 7.5 g of an acetylacetone derivative (G1), and 0.85 g of sodium carbonate were loaded into a 200-ml three-necked flask, and the mixture was stirred in a nitrogen stream at room temperature for 1 hour. After that, the resultant was stirred under reflux for 7 hours. The reactant was cooled with ice, and the precipitate was obtained by filtration and cleaned with water. The precipitate was cleaned with ethanol and dissolved in chloroform, and then insoluble matter was filtrated. After having been condensed, the filtrate was recrystallized with chloroform-methanol, whereby 1.1 g of the reddish brown powder of (G2), that is, Compound 3 was obtained.

The emission spectrum of a solution of this compound in toluene had a λmax of 618 nm.

EXAMPLE 4

In this example, a device having a device constitution shown in FIG. 1B formed of three organic layers was used. ITO having a thickness of 100 nm (transparent electrode 14) was patterned onto a glass substrate (transparent substrate 15) so that an electrode area would be 3.14 mm$^2$. The following organic layers and electrode layers were stacked on the resultant ITO substrate by a spin coating film formation method or a vacuum vapor deposition method under a pressure reduced to 10$^{-4}$ Pa, whereby a device was produced.

(1) Hole injection/transport layer 13 (400 Å) PEDOT/PSS Al 4083 (manufactured by Baytron) was formed into a film on the ITO substrate by a spin coating method (2,000 rpm/2 min+200° C. drying under a nitrogen atmosphere).

(2) Light-emitting layer 12 (400 Å): A 0.2 wt % solution of Compound 1 in toluene was prepared, and was formed into a film by a spin coating method (1,000 rpm/1 min+80° C. drying under a nitrogen atmosphere).

(3) Electron transport layer 16 (200 Å): Bphen (manufactured by Sigma-Aldrich Corporation) was formed into a film by a vapor deposition method.

(4) Metal electrode 11: LiF was formed into a film having a thickness of 10 Å by a vapor deposition method. Al was formed into a film having a thickness of 1,200 μm on the LiF film by a vapor deposition method.

The resultant device was able to provide a current efficiency of 9 cd/A and a power efficiency of 7 lm/W at a luminance of 600 cd/m$^2$. In this case, an emission spectrum peaked at 620 nm, and had CIE chromaticity coordinates of (0.66, 0.34).

In addition, the device was subjected to a luminance durability test (initial luminance 1,000 cd/m$^2$). As a result, a luminance half time (time period for the initial luminance to reduce in half, that is, 500 cd/m$^2$) was 150 hours.

EXAMPLES 5 TO 7 COMPARATIVE EXAMPLES 1 AND 2

Devices were produced in the same manner as in Example 4 except that the compounds shown in Table 5 were used instead of Compound 1, and were evaluated in the same manner as in Example 4. Table 5 shows the results.

In addition, the structural formula of Ir(piq)$_2$ (acac) used in each comparative example is shown below.

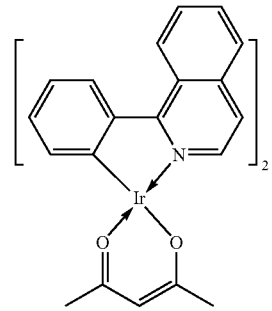

The device of Comparative Example 1 underwent quenching (short circuit of the device) at a luminance of 500 cd/m$^2$.

In addition, emission unevenness was observed in the device of Comparative Example 2, and it was confirmed that the molecules of Ir(piq)$_2$ (acac) agglomerated in pentafluorene.

TABLE 5

| | Light-emitting layer | Current efficiency (cd/A) | Power efficiency (1 m/W) | Peak (nm) | CIE chromaticity coordinates | Luminance half time (h) |
|---|---|---|---|---|---|---|
| Example 4 | Compound 1 | 9 | 7 | 620 | (0.66, 0.34) | 150 |
| Example 5 | Compound 3 | 10 | 7 | 619 | (0.65, 0.34) | 130 |
| Example 6 | Compound 2 | 8 | 5 | 618 | (0.64, 0.33) | 100 |
| Example 7 | Compound 1 + pentafluorene (Weight ratio 20:80) | 12 | 9 | 619 | (0.66, 0.34) | 400 |
| Comparative example 1 | Ir(piq)$_2$(acac) | — | — | — | — | — |
| Comparative example 2 | Ir(piq)$_2$(acac) + pentafluorene (Weight ratio 20:80) | 2 | 1.2 | — | — | 25 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-165462, filed Jun. 15, 2006, which is hereby incorporated by reference herein in its entirety.

What is claimed is:

1. An organic electroluminescence device comprising an anode, a cathode, and an organic layer disposed between the anode and the cathode, wherein the organic layer is a light-emitting layer and comprises pentafluorene and the aromatic oligomer represented by the following structural formula:

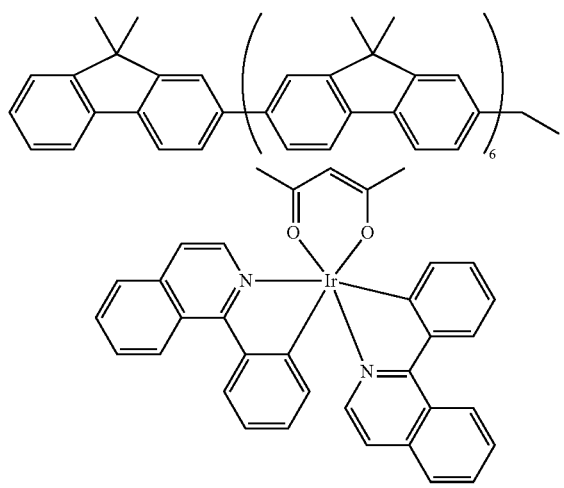

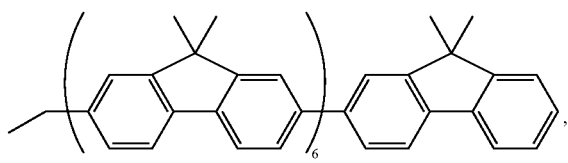

and wherein a weight of the aromatic oligomer is less than a weight of the pentafluorene.

2. The organic electroluminescence device according to claim 1, wherein the light-emitting layer is a layer formed by a coating method.

3. A display apparatus, which comprises the organic electroluminescence device according to claim 1 and a thin-film transistor, and is driven according to a passive system.

4. A display apparatus, which comprises the organic electroluminescence device according to claim 1 and a thin-film transistor, and is driven according to an active system.

* * * * *